(12) United States Patent
Wang et al.

(10) Patent No.: US 9,257,338 B2
(45) Date of Patent: Feb. 9, 2016

(54) TSV SUBSTRATE STRUCTURE AND THE STACKED ASSEMBLY THEREOF

(71) Applicant: Industrial Technology Research Institute, Hsin-Chu (TW)

(72) Inventors: Chung-Chih Wang, Taipei County (TW); Pei-Jer Tzeng, Hsinchu (TW); Cha-Hsin Lin, Tainan (TW); Tzu-Kun Ku, Hsinchu (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days.

(21) Appl. No.: 14/615,922

(22) Filed: Feb. 6, 2015

(65) Prior Publication Data

US 2015/0155204 A1 Jun. 4, 2015

Related U.S. Application Data

(60) Division of application No. 13/845,869, filed on Mar. 18, 2013, now abandoned, which is a continuation-in-part of application No. 12/969,250, filed on Dec. 15, 2010, now abandoned.

(30) Foreign Application Priority Data

Nov. 26, 2010 (TW) .............................. 99141056 A

(51) Int. Cl.
*H01L 29/40* (2006.01)
*H01L 21/768* (2006.01)
(Continued)

(52) U.S. Cl.
CPC ...... *H01L 21/76898* (2013.01); *H01L 21/3212* (2013.01); *H01L 21/32133* (2013.01);
(Continued)

(58) Field of Classification Search
CPC ............ H01L 21/568; H01L 21/76224; H01L 21/76232; H01L 23/481; H01L 25/0557; B23K 3/0623
See application file for complete search history.

(56) References Cited

U.S. PATENT DOCUMENTS 6,188,028 B1 2/2001 Haba et al.
6,239,495 B1 5/2001 Sakui et al.
(Continued)

FOREIGN PATENT DOCUMENTS

WO 2009140252 A2 11/2009

OTHER PUBLICATIONS

Liu et al. "A 300-mm Wafer-Level Three-Deimensional Integration Scehem Using Tungsten Through-Silicon Via and Hybrid Cu-Adhesive Bondng" IEEE, DEC> 2008; IBM T.J. Watson Research Center. Yorktown Heights, NY 10598, USA. IBM Semiconductor Research and Development Center, 2070 Route 52. Hopewell Junction, NY 12533. USA.

(Continued)

*Primary Examiner* — Jerome Jackson, Jr.
*Assistant Examiner* — Fang-Xing Jiang
(74) *Attorney, Agent, or Firm* — WPAT, PC; Justin King

(57) ABSTRACT

The disclosure provides a TSV substrate structure and the stacked assembly of a plurality of the substrate structures, the TSV substrate structure including: a substrate comprising a first surface, a corresponding second surface, and a TSV communicating the first surface with the second surface through the substrate; and a conductor unit completely filling the TSV, the conductor unit comprising a conductor body which has a first and a second ends corresponding to the first and second surfaces of the substrate, respectively.

3 Claims, 25 Drawing Sheets

(51) Int. Cl.
- *H01L 23/48* (2006.01)
- *H01L 23/538* (2006.01)
- *H01L 23/00* (2006.01)
- *H01L 21/321* (2006.01)
- *H01L 21/3213* (2006.01)
- *H01L 25/00* (2006.01)

(52) U.S. Cl.
CPC .... *H01L21/76865* (2013.01); *H01L 21/76871* (2013.01); *H01L 21/76883* (2013.01); *H01L 23/481* (2013.01); *H01L 23/5384* (2013.01); *H01L 23/562* (2013.01); *H01L 25/50* (2013.01); *H01L 2224/0401* (2013.01); *H01L 2224/05009* (2013.01); *H01L 2224/0557* (2013.01); *H01L 2224/13* (2013.01); *H01L 2224/13009* (2013.01); *H01L 2224/13023* (2013.01); *H01L 2224/16* (2013.01); *H01L 2224/16146* (2013.01); *H01L 2224/81* (2013.01); *H01L 2224/8114* (2013.01); *H01L 2224/81911* (2013.01); *H01L 2225/06541* (2013.01); *H01L 2924/00014* (2013.01)

(56) References Cited

U.S. PATENT DOCUMENTS

| | | | |
|---|---|---|---|
| 6,454,159 B1 * | 9/2002 | Takushima | B23K 3/0623 228/248.1 |
| 7,741,148 B1 | 6/2010 | Marimuthu et al. | |
| 7,847,379 B2 | 12/2010 | Chung | |
| 2001/0021567 A1 * | 9/2001 | Takahashi | H01L 21/76232 438/424 |
| 2002/0003275 A1 * | 1/2002 | Lee | H01L 21/76224 257/510 |
| 2002/0028532 A1 | 3/2002 | Tsunashima | |
| 2007/0105304 A1 | 5/2007 | Kasai et al. | |
| 2009/0001543 A1 * | 1/2009 | Chung | H01L 25/0657 257/686 |
| 2009/0121323 A1 | 5/2009 | Kwon et al. | |
| 2009/0206477 A1 | 8/2009 | Maebashi et al. | |
| 2009/0224371 A1 | 9/2009 | Yu et al. | |
| 2009/0243045 A1 * | 10/2009 | Pagaila | H01L 21/568 257/621 |
| 2009/0267194 A1 | 10/2009 | Chen | |
| 2010/0096753 A1 | 4/2010 | Hwang et al. | |
| 2010/0159643 A1 | 6/2010 | Takahashi et al. | |
| 2010/0320575 A9 * | 12/2010 | Chauhan | H01L 23/481 257/621 |

OTHER PUBLICATIONS

Leduc et al. "First integration of Cu TSV using die-to-wafer direct bonding and planarization",2009, IEEE, CEA-Leti Minatec,Grenoble,France,STMicroelectronics,Crolles, France.

Chen et al. "Investigations of Cu Bond Structures and Demonstration of a Wafer—Level 3D Integration Scheme with W TSV" Department of Electronics Engineering, National Chiao Tung University. Hsinchu 300.Taiwan,2010 IEEE, pp. 162-163, IBM T.J. Watson Research Center.Yorktown Heights. NY 10598.USA Laboratory for Physical Sciences,University of Maryland College Park.MD.USA Rensselaer Polytechnic Institute Troy. New York.USA.

Chen et al."Strucure Design and Process Control for Cu Bonded Interconnects in 3D Integrated Circuits"; Dec. 2006; IBM T.J. Watson Research Center.1101 Kitchawan Road. Yorktown Heights. NY 10598.USA.

Taiwan Patent Office, "Office Action", Nov. 20, 2013.

* cited by examiner

TSV SUBSTRATE STRUCTURE AND THE STACKED ASSEMBLY THEREOF

The present application is a continuation-in-part of parent application Ser. No. 13/845,869, filed Mar. 18, 2013, which claims the benefit of Taiwan Patent Application No. 099141056, filed on Nov. 26, 2010. The parent application and the Taiwan application are hereby incorporated by reference for all purposes as if fully set forth herein.

TECHNICAL FIELD

The present disclosure relates to a device of three-dimensional integrated circuit (3DIC), and more particularly, to a substrate structure with a through-silicon via (TSV) and the stacked assembly of a plurality of the substrate structures.

TECHNICAL BACKGROUND

The advantages of the three-dimensional-integrated-circuit (3DIC) technique, such as high performance, low power dissipation, low cost, compactness, integration of hetero-generous IC substrates, lead to a potential trend for developing the System on Chip (SoC). Wherein the through-silicon-via (TSV) technique plays a key role of being capable of overcoming the limitations by the IC fabrication process and the low dielectric-constant material, so that the interconnection among the stacked IC chips can be with lower cost and higher performance.

However, misalignment between the TSVs of the stacked IC substrates or conductor bumps between the stacked IC chips happened frequently in the assembly process of the 3DIC, which may lead to potential errors or distortions in the communication of electrical signals. Furthermore, the reliability of the interconnection or assembly of the TSVs is subject to the bumps, which tend to increase the resistance of TSV connection and, even more, to cause cracks or defects of opened circuit. Therefore, it is in need to develop a reliable structure of TSV substrates.

TECHNICAL SUMMARY

According to one aspect of the present disclosure, a first embodiment provides a TSV substrate structure including: a substrate comprising a first surface, a corresponding second surface, and a TSV communicating the first surface with the second surface through the substrate; and a conductor unit completely filling the TSV, the conductor unit comprising a conductor body which has a first and a second ends corresponding to the first and second surfaces of the substrate, respectively.

According to another aspect of the present disclosure, a second embodiment provides a stacked assembly comprising a plurality of substrate structures stacked on each other, each of the substrate structures including: a substrate comprising a first surface, a corresponding second surface, and a TSV communicating the first surface with the second surface through the substrate; and a conductor unit completely filling the TSV, the conductor unit comprising a conductor body which has a first and a second ends corresponding to the first and second surfaces of the substrate, respectively.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

Figure 1:
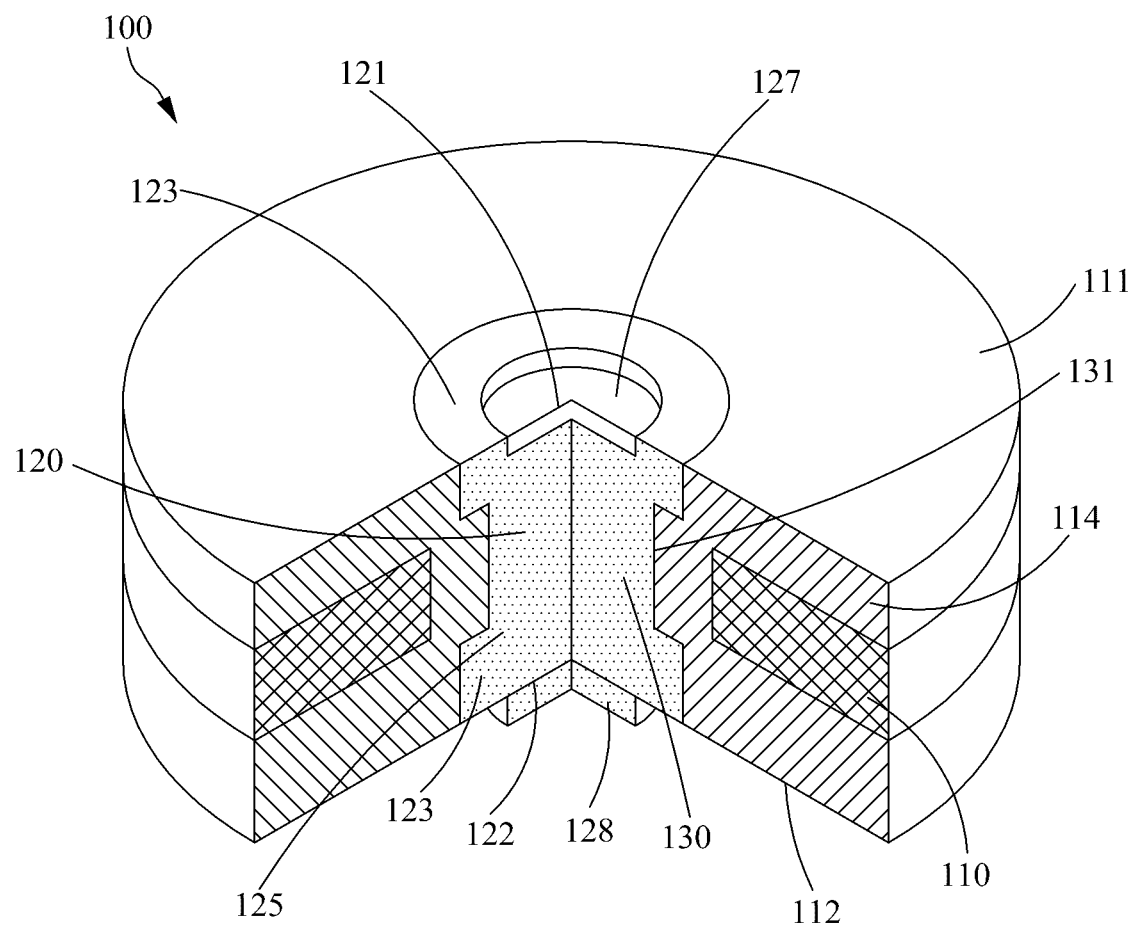
FIG. 1 is a perspective view of a TSV substrate structure according to a first embodiment of the present disclosure.

For further understanding and recognizing the fulfilled functions and structural characteristics of the disclosure, several exemplary embodiments cooperating with detailed description are presented as the following. Hereinafter, for the description of the embodiments, in the case of describing as forming each layer (film), portions, patterns or structures "on" or "under" substrates, each layer (film), portions, or patterns, "on" or "under" includes all of "directly" or "indirectly" formed things. In addition, a standard about "on" or "under" each layer will be described based on the drawings. In the drawings, a thickness or size of each layer is shown roughly, exaggeratedly, or briefly for sake of convenience of description or for a definite description. In addition, a size of each element does not reflect entirely real size.

Please refer to FIG. 1, which is a perspective view of a TSV substrate structure according to a first embodiment of the present disclosure. In FIG. 1, the TSV substrate structure 100 comprises a substrate 110 having a TSV 130 and a conductor unit 120 completely filling the TSV 130. The conductor unit 120 is used as a channel of electrical and thermal interconnection to build up a 3DIC.

The substrate 110 has a top surface and a bottom surface, or in terms of the first surface 111 and second surface 112 in this embodiment. The substrate 110 includes at least one TSV 130, which communicates the first surface 111 with the second surface 112 through the substrate body. The TSV 130 itself has a column-shaped space to receive conductor or metal, so as to connect the two sides of the substrate 110 electrically or thermally. For sake of simplicity, only one TSV is depicted in the specification and drawings to illustrate the structure and fabrication of the embodiments; but is not limited thereby, which can be more than one TSV. Moreover, the TSV 130 or the conductor unit 120 has a column body with a circular cross-section; but is not limited thereby, which can be with a cross-section of rectangle, rhombus, polygon, or other shapes in accordance with the practical demand.

As shown in FIG. 1, an insulator layer 114 is formed on the side surface of the TSV 130 to electrically isolate the conductor unit 120 from the devices or circuits in the substrate 110. In this embodiment, the insulator layer 114 is also formed on the first and/or second surfaces 111/112 of the substrate 110. The substrate 110 may be a die, a chip, a wafer, an interposer connecting a die or a chip to a printed-circuit board (PCB), or the combinations thereof, which are all applicable to the embodiment.

The conductor unit 120, which completely fills the TSV 130 and has a conductor body 125 corresponding to the TSV 130, has a top and bottom terminals, or in terms of the first end 121 and second end 122, corresponding to the first and second surfaces 111/112 of the substrate, respectively. This embodiment is characterized partly by the solid and complete filling of the conductor body 125 in the TSV 130, so as to increase conductivity and reliability of the conductor unit 120. This embodiment is also characterized by an extensional part 123 formed on the side surface of the conductor body in proximity to the first or/and second ends of the conductor unit 120. As shown in FIG. 1, the extensional parts 123 of conductor are formed to surround the conductor body 125 at both ends. The extensional part 123 is used to enhance the positioning area of alignment when more than one TSV substrate structures 100 are stacked or assembled to form a 3DIC device. The extensional part 123 is provided in this embodiment to increase the tolerance of aligning the TSVs between the TSV substrate structures 100 and hence to diminish the parasitical devices or circuits due to the misalignment. The extensional part 123 may be formed at one or both ends of the conductor unit 120, or may not be formed at either end; this depends on the practical demand.

In order to facilitate alignment and assembly of the IC substrates with TSVs and to enhance the structural robustness of the assembly, the conductor unit 120 further comprises a recess 127 formed in the base surface of the conductor body 125 at the first end 121 and a protrusion 128 formed on the other base surface of the conductor body 125 at the second end 122, as the embodiment illustrated in FIG. 1. It should be noted that the recess 127 is not smaller than the protrusion 128 in area and is not higher than the protrusion 128 in highness, to facilitate the alignment and assembly in the succeeding fabrication process of the stacked assembly of the TSV IC substrates. The conductor unit 120 is composed of copper in this embodiment, while it can be composed of the other metal or conductor material. Furthermore, the conductor unit 120 has a cross-section of circle in the embodiment, while it can be with a cross-section of rectangle, rhombus, polygon, or other shapes corresponding to the TSV 130.

Figure 2A:
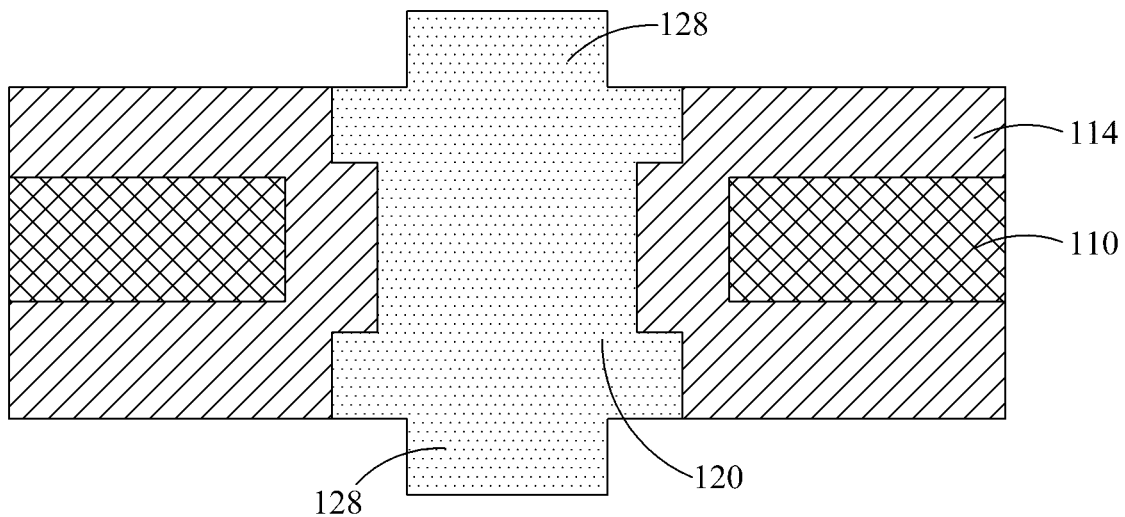
FIGS. 2A and 2B are TSV substrate structures of the protrusion$_{top}$-protrusion$_{bottom}$ and recess$_{top}$-recess$_{bottom}$ types, respectively, according to the first embodiment.
Figure 2B:
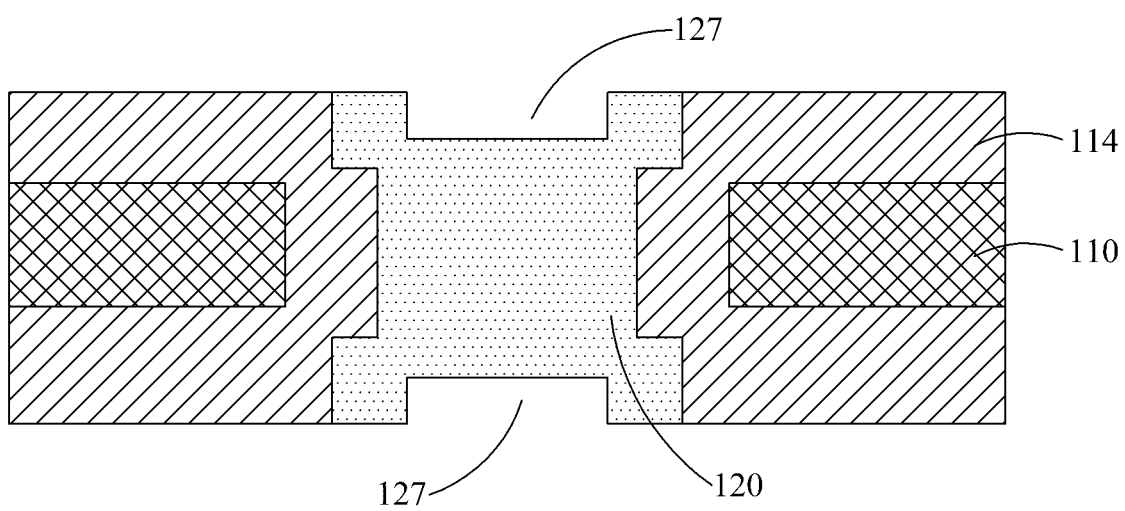

The formation of the protrusion on or the recess in the base surfaces of the two ends the conductor unit 120 may be in the other type. For example, a recess may be formed in the bottom surface of the conductor body while a protrusion formed on the top surface of the conductor body. Further, two protrusions may be formed respectively on both base surfaces of the conductor body as shown in FIG. 2A; or two recesses may be formed respectively in both base surfaces of the conductor body as shown in FIG. 2B. The IC substrates with one of the two forgoing types of conductor units in the TSV 130 can be assembled correspondingly. This will be described in detail in the succeeding embodiments. The protrusion or recess may be formed at one or both ends of the conductor unit 120, or may not be formed at either end; this depends on the practical demand.

To construct a 3DIC device, IC substrates of various potential types of conductor units in the TSV in the first embodiment may be stacked on each other or on a carrier. In a second embodiment according this present disclosure, a stacked assembly comprises: a first TSV substrate structure formed of one of possible types of conductor units in the TSV according to the first embodiment, a second TSV substrate structure formed of one of possible types of conductor units in the TSV according to the first embodiment, wherein the second TSV substrate structure is stacked on the first TSV substrate structure. Preferably, the TSV in the first TSV substrate structure corresponds to the TSV in the second TSV substrate structure.

Figure 3A:
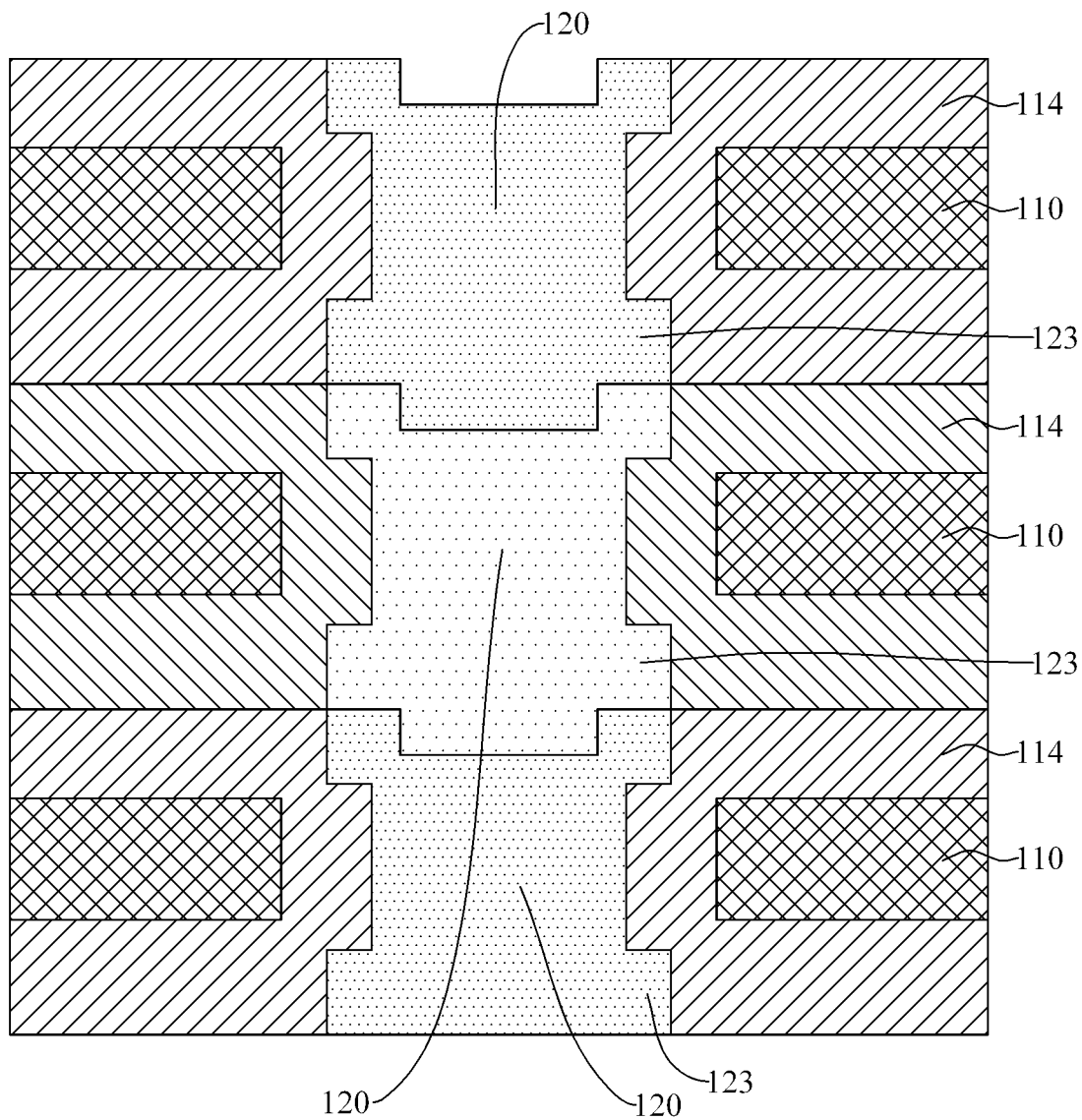
FIGS. 3A to 3C are architectures of the stacked assembly according to the second embodiment of the present disclosure: example 1 to 3, respectively.
Figure 3B:
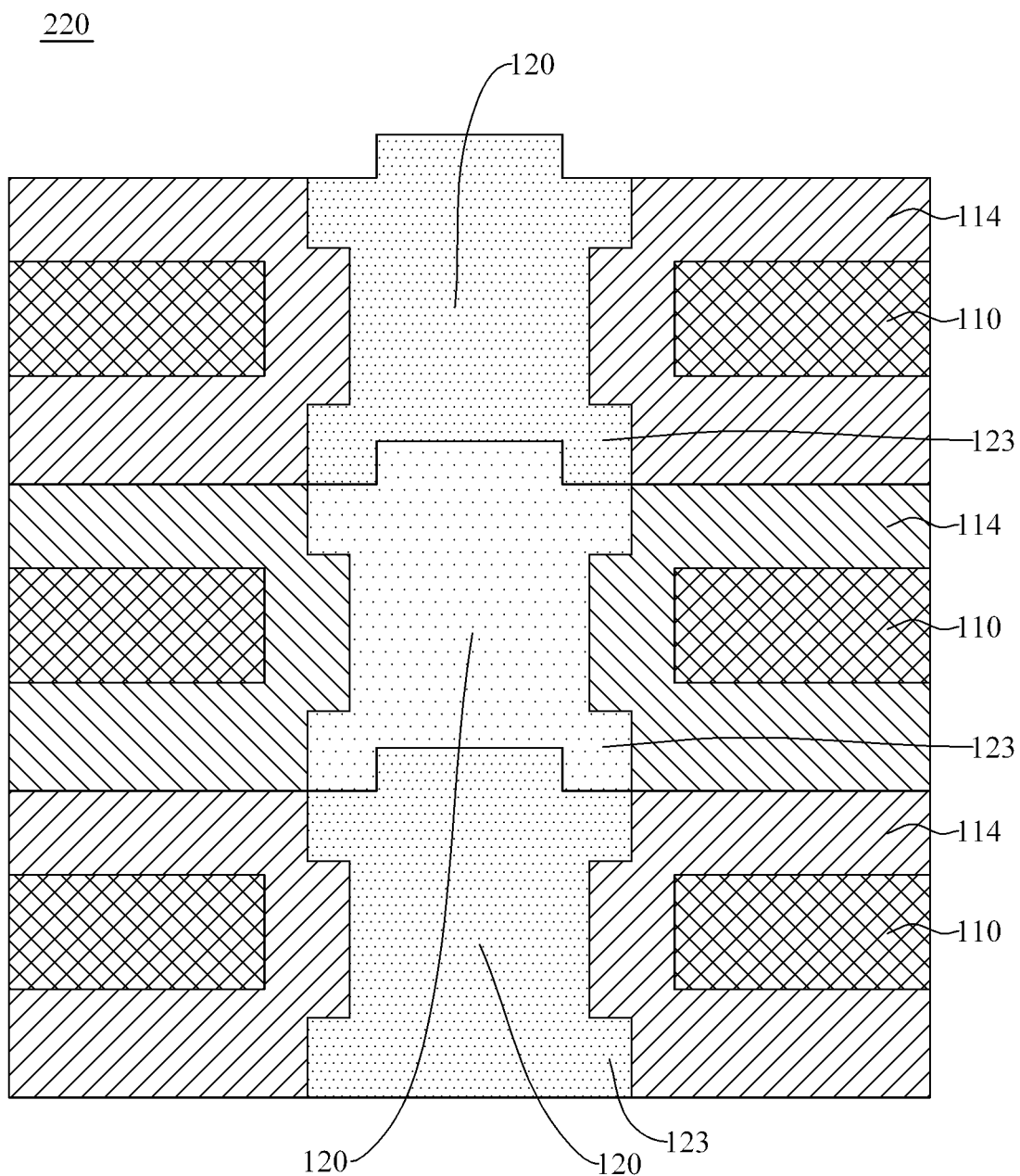
Figure 3C:
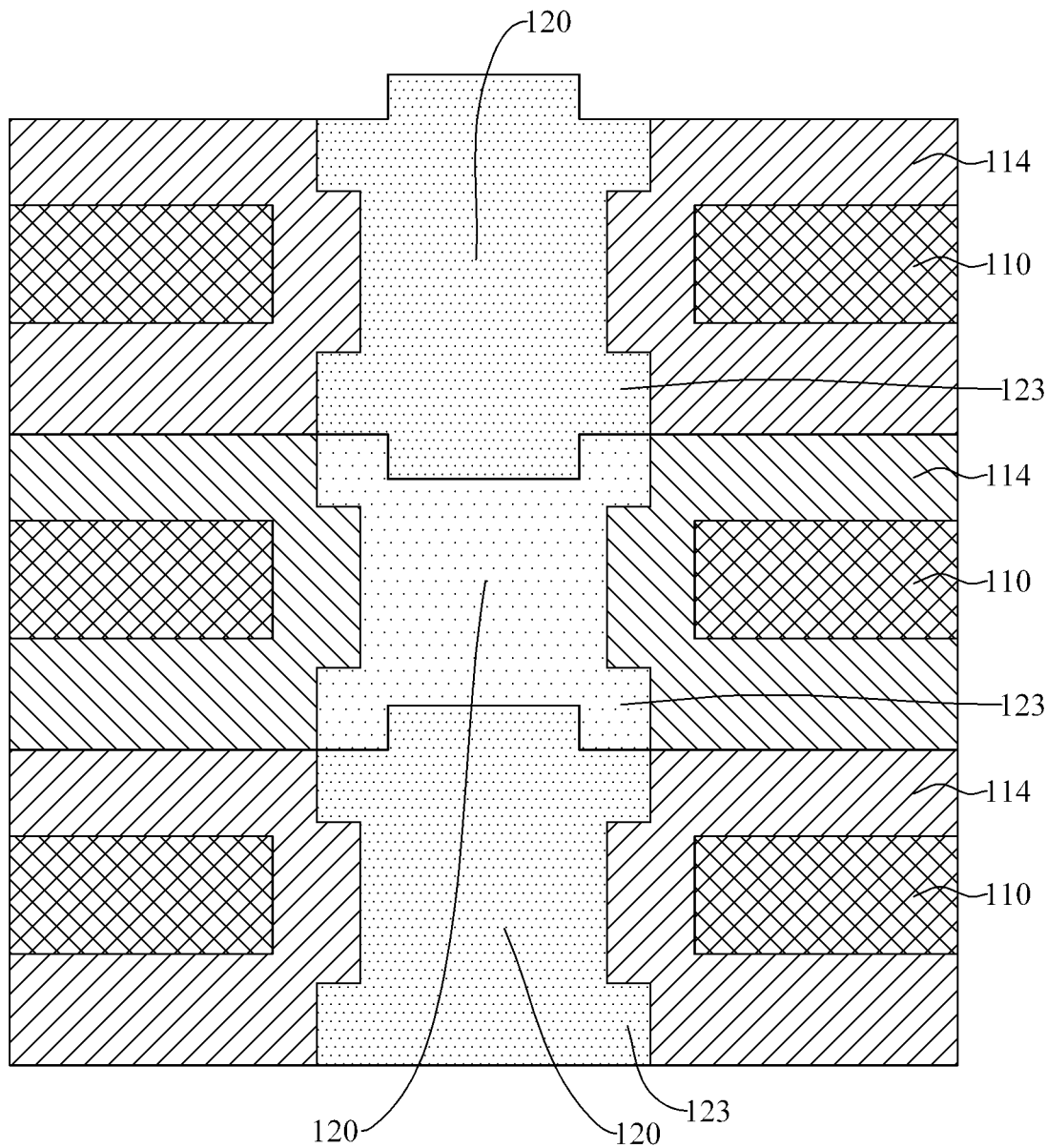

Please refer to FIGS. 3A to 3C, which illustrate three examples of the stacked assembly according to the second embodiment. Example 1 provides the stacked assembly of the TSV substrate structures of the $recess_{top}$-$protrusion_{bottom}$ type as schematically shown in FIG. 3A, where a recess is formed in the top surface of the conductor body while a protrusion formed on the bottom surface of the conductor body in each TSV substrate structure. Example 2 describes the stacked assembly of the TSV substrate structures of the $protrusion_{top}$-$recess_{bottom}$ type as schematically shown in FIG. 3B, where a protrusion is formed on the top surface of the conductor body while a recess formed in the bottom surface of the conductor body in each TSV substrate structure. On the contrary, example 3 describes the stacked assembly of the TSV substrate structures of the $recess_{top}$-$recess_{bottom}$ and $protrusion_{top}$-$protrusion_{bottom}$ types as schematically shown in FIG. 3C, where the $recess_{top}$-$recess_{bottom}$ type means that two recesses are formed respectively in both base surfaces of the conductor body, while the $protrusion_{top}$-$protrusion_{bottom}$ type is that two protrusions are formed respectively on both base surfaces. It should be noted in the neighboring TSV IC substrates that the recess is not smaller than the corresponding protrusion in area and is not higher than the corresponding protrusion in highness, to facilitate the alignment and assembly of the TSV IC substrates. The assembly may be proceeded as the following: providing TSV substrate structures with corresponding recesses and/or protrusions; aligning the TSVs and corresponding the conductor unit of the TSV substrate structures, and stacking one TSV substrate structure on the another one; and pressing the stacked TSV substrate structures vertically to the substrate surfaces. Since the recess is not smaller than the corresponding protrusion in area and is not higher than the corresponding protrusion in highness, the pressure on the stacked TSV substrate structures can deform the conductor of metal or the like to fix the recess and protrusion tightly and coincidently at the connection point, so as to increase conductivity and reliability of the TSV interconnection.

Figure 4A:
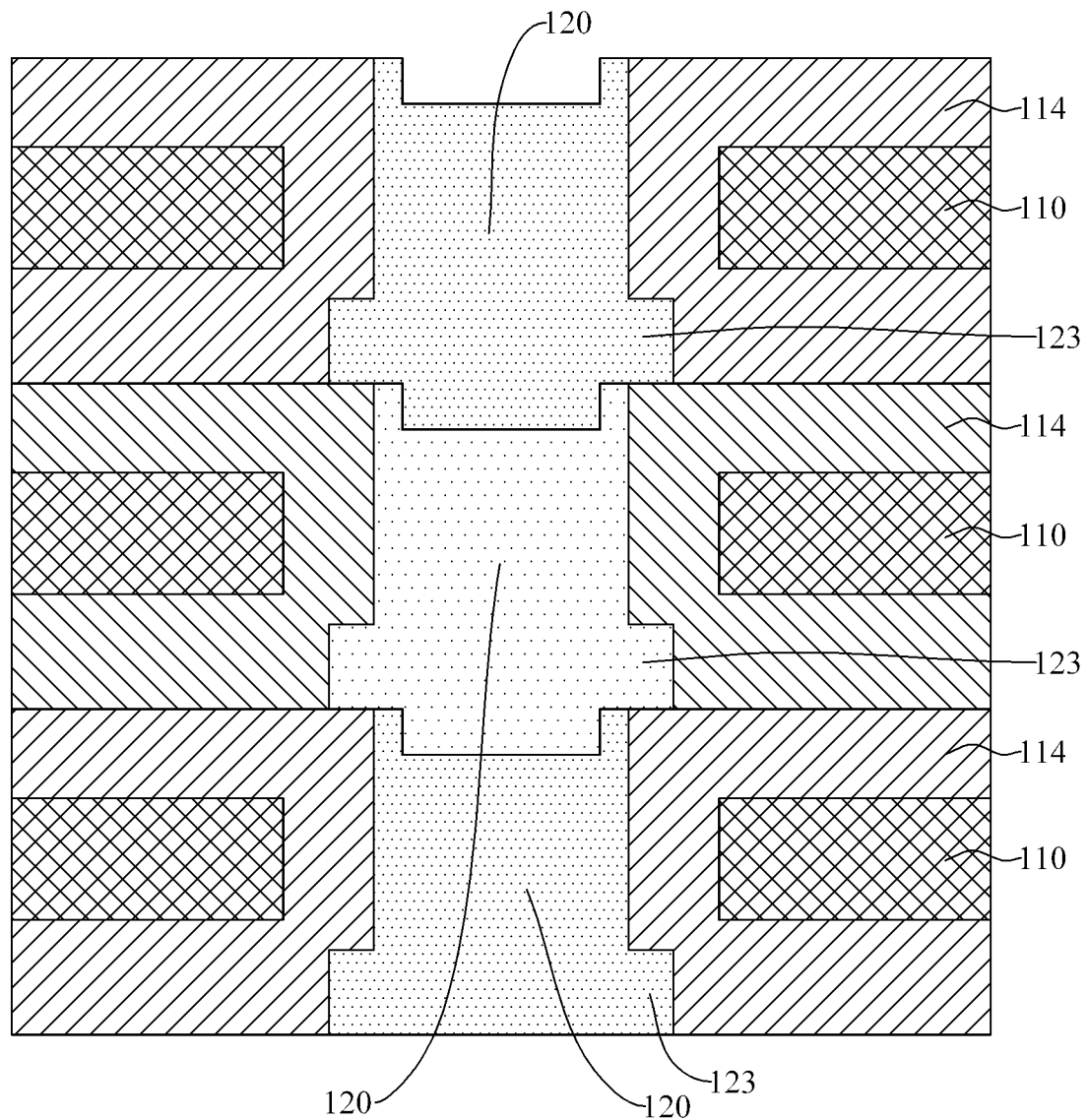
FIGS. 4A and 4B are architectures of the stacked assembly of example 4 according to the second embodiment: with and without the insulator layer on the substrate surfaces, respectively.
Figure 4B:
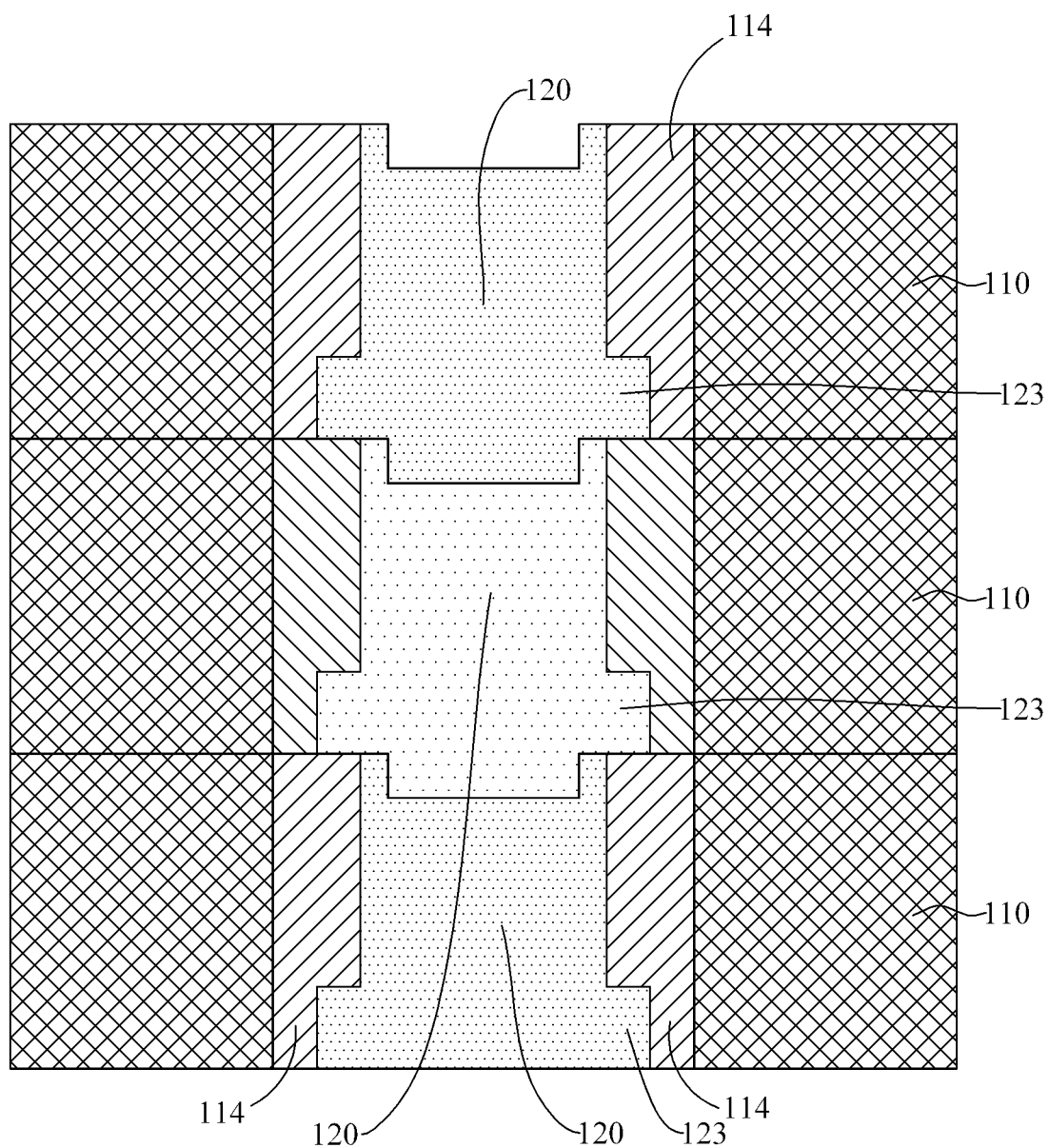
Figure 5A:
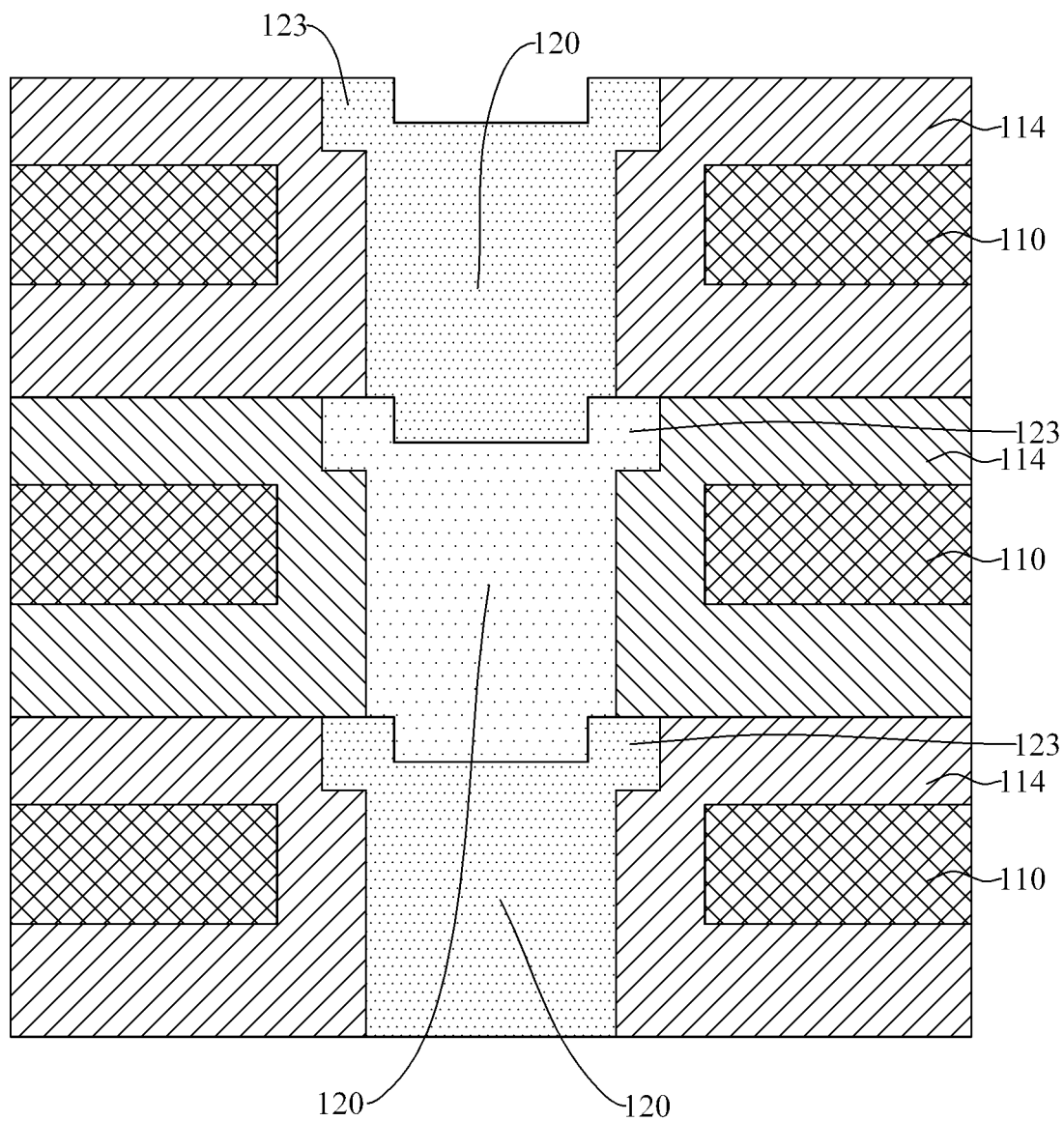
FIGS. 5A and 5B are architectures of the stacked assembly of example 5 according to the second embodiment: with and without the insulator layer on the substrate surfaces, respectively.
Figure 5B:
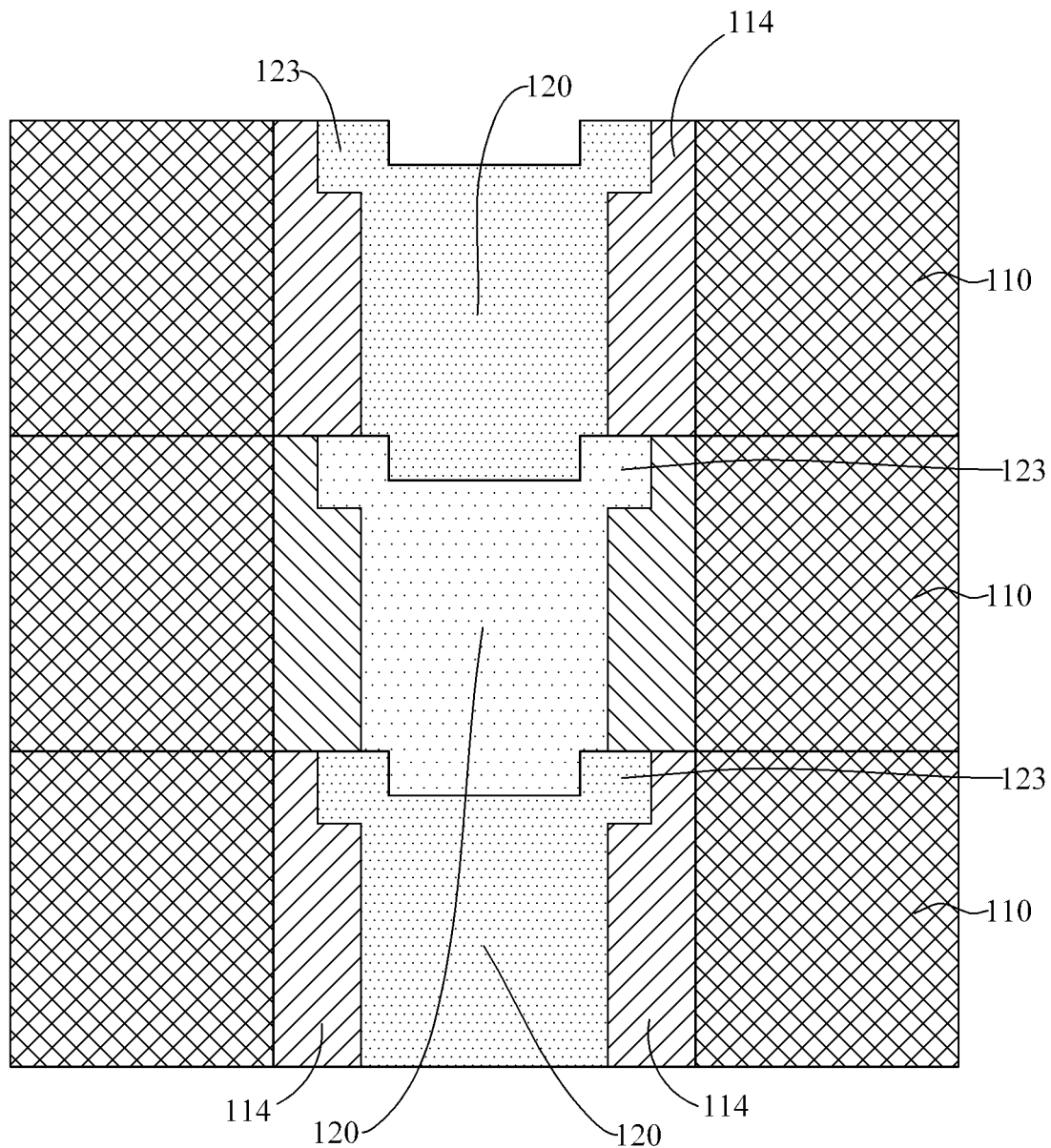
Figure 6A:
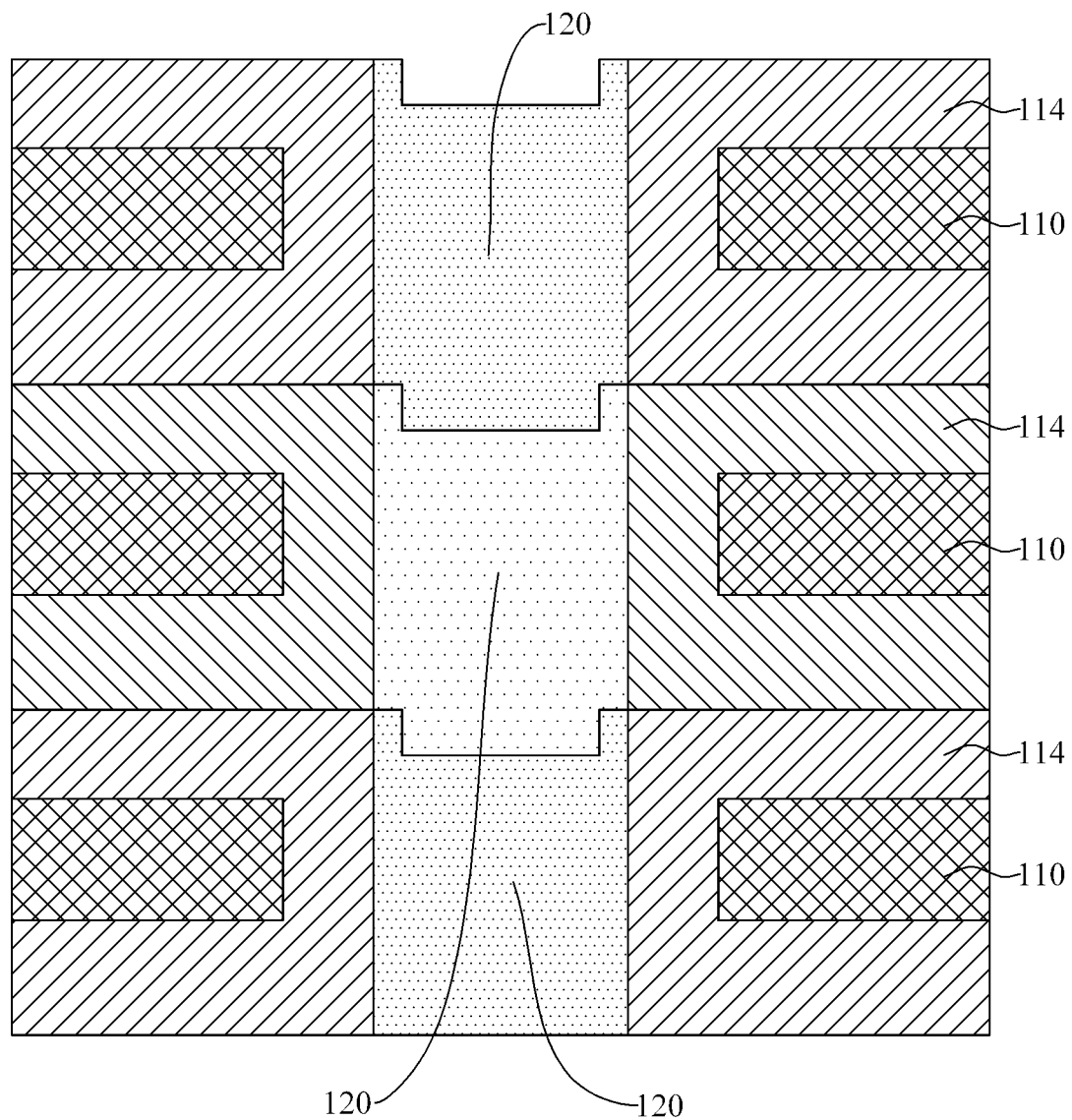
FIGS. 6A and 6B are architectures of the stacked assembly of example 6 according to the second embodiment: with and without the insulator layer on the substrate surfaces, respectively.
Figure 6B:
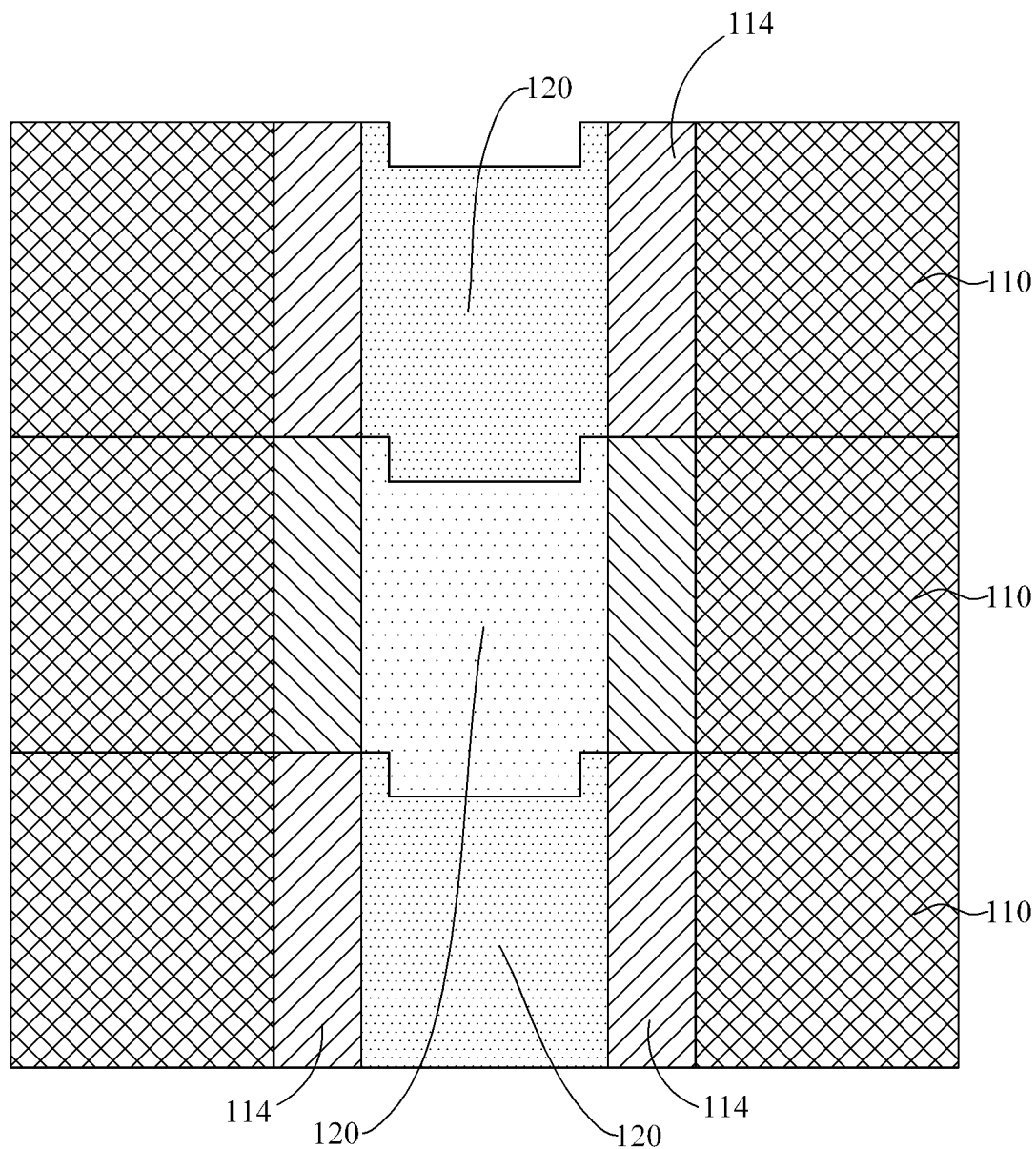

Based on the TSV substrate structures of the $recess_{top}$-$protrusion_{bottom}$ type, several more exemplary embodiments of various TSV substrate structures are provided below. Example 4 provides the stacked assembly of the TSV substrate structures as schematically shown in FIGS. 4A and 4B, where each TSV substrate structure have a conductor unit with an extensional part surrounding the conductor body only in proximity to the bottom; FIG. 4A illustrates each substrate with insulator layers on the side surface of the TSV and on the top and bottom surfaces of the substrate, while FIG. 4B illustrates each substrate with insulator layers only on the side surface of the TSV. Example 5 provides the stacked assembly of the TSV substrate structures as schematically shown in FIGS. 5A and 5B, where each TSV substrate structure have a conductor unit with an extensional part surrounding the conductor body only in proximity to the top; FIG. 5A illustrates each substrate with insulator layers on the side surface of the TSV and on the top and bottom surfaces of the substrate, while FIG. 5B illustrates each substrate with insulator layers only on the side surface of the TSV. Example 6 provides the stacked assembly of the TSV substrate structures as schematically shown in FIGS. 6A and 6B, where each TSV substrate structure does not have any extensional part at the top or bottom; FIG. 6A illustrates each substrate with insulator layers on the side surface of the TSV and on the top and bottom surfaces of the substrate, while FIG. 6B illustrates each substrate with insulator layers only on the side surface of the TSV.

Figure 7A:
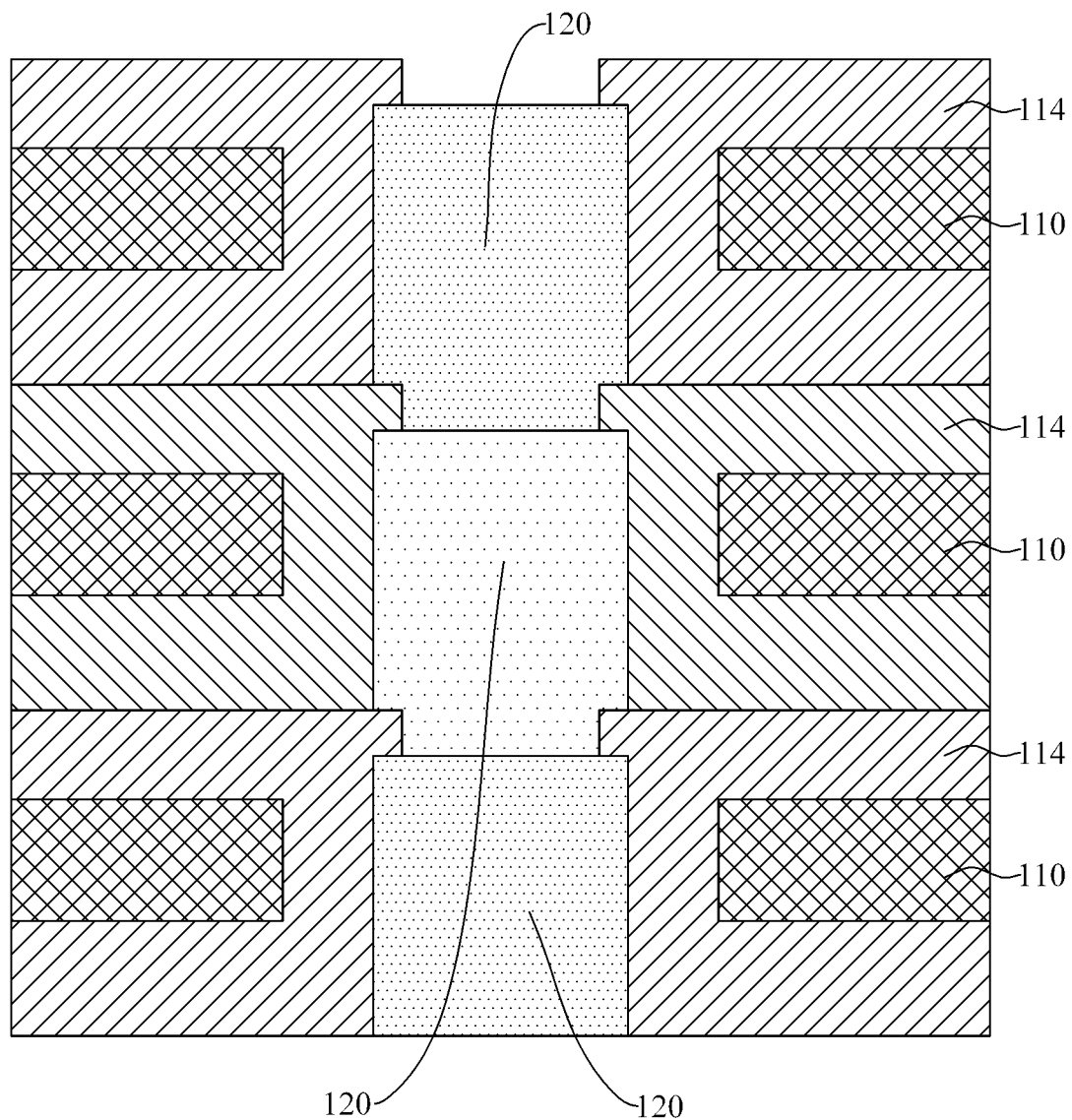
FIGS. 7A and 7B are architectures of the stacked assembly of example 7 according to the second embodiment: with and without the insulator layer on the substrate surfaces, respectively.
Figure 7B:
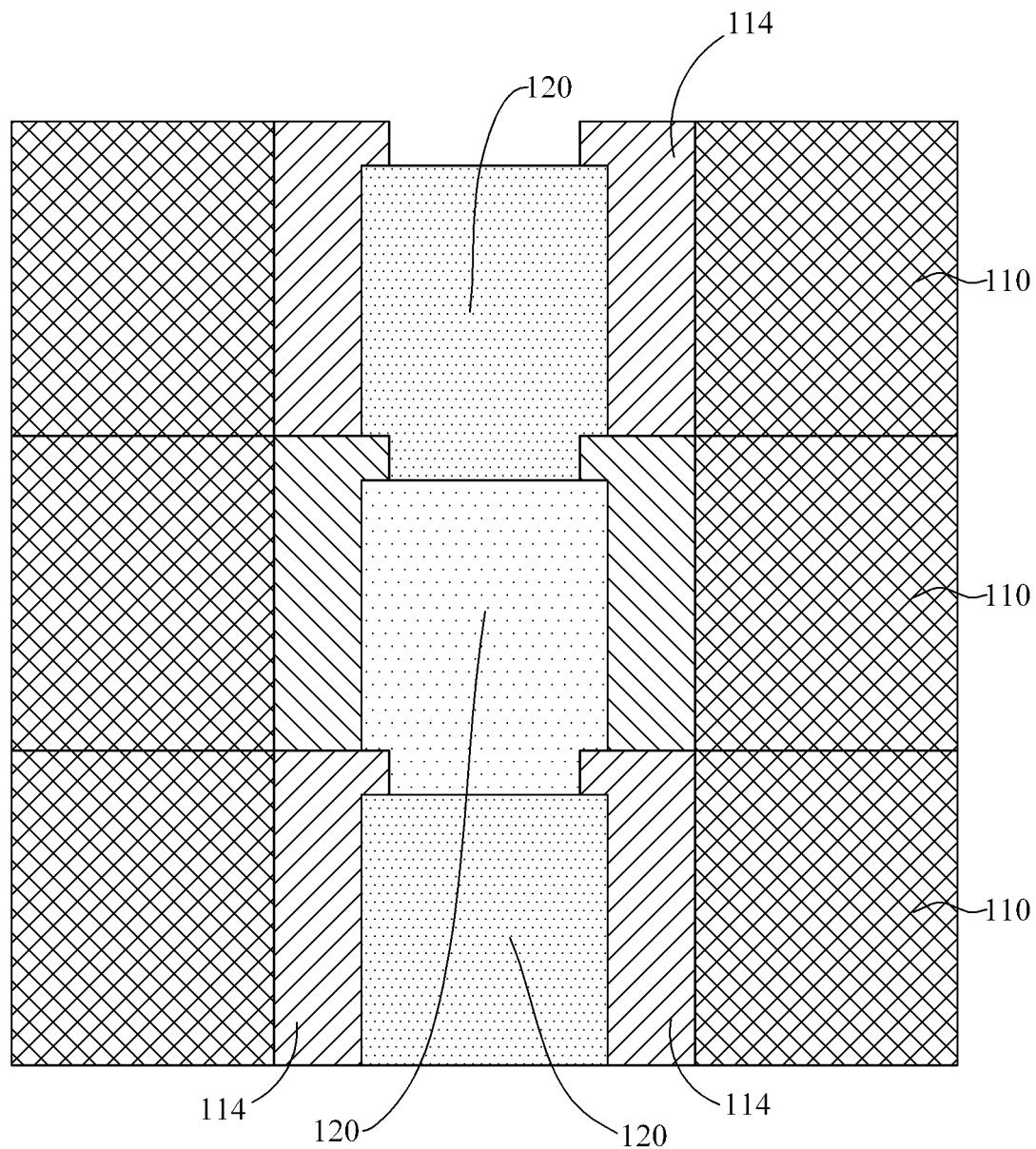

Example 7 provides the stacked assembly of the TSV substrate structures as schematically shown in FIGS. 7A and 7B, where each TSV substrate structure does not have any extensional part at either the top or bottom, each TSV substrate structure has a protrusion formed on the bottom surface of the conductor unit, and the insulator layer further includes a recessed portion formed on the base surface of the conductor body at the top end, wherein the area of the recessed portion is not larger than the cross-sectional area of the conductor body and is larger than the protrusion at the bottom; FIG. 7A illustrates each substrate with insulator layers on the side surface of the TSV and on the top and bottom surfaces of the substrate, while FIG. 7B illustrates each substrate with insulator layers only on the side surface of the TSV. It should be noted, the TSV substrate structures in the second embodiment or in the foregoing examples in FIGS. 3 to 7 are not required to be in one identical type, TSV substrate structures of various types can be stacked or assembled according to this present disclosure.

Figure 8A:
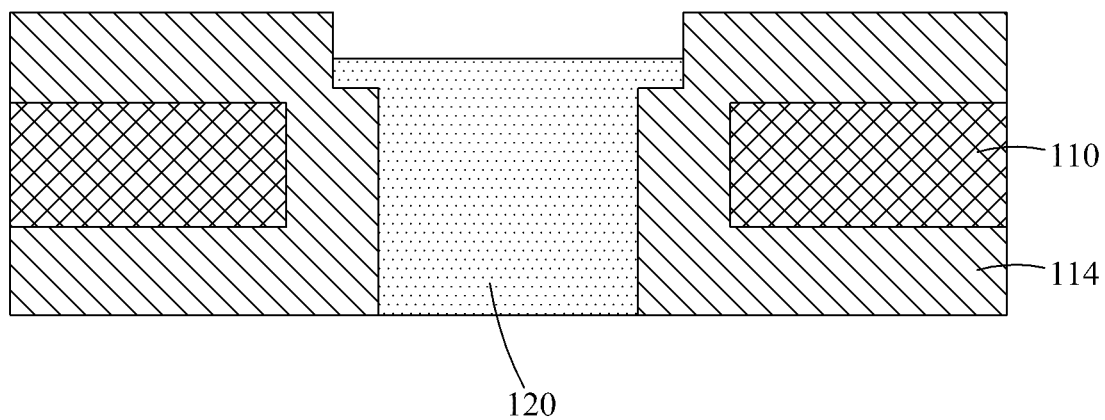
FIGS. 8A to 8M are the evolutional steps of fabricating the TSV substrate structure of FIG. 1.
Figure 8B:
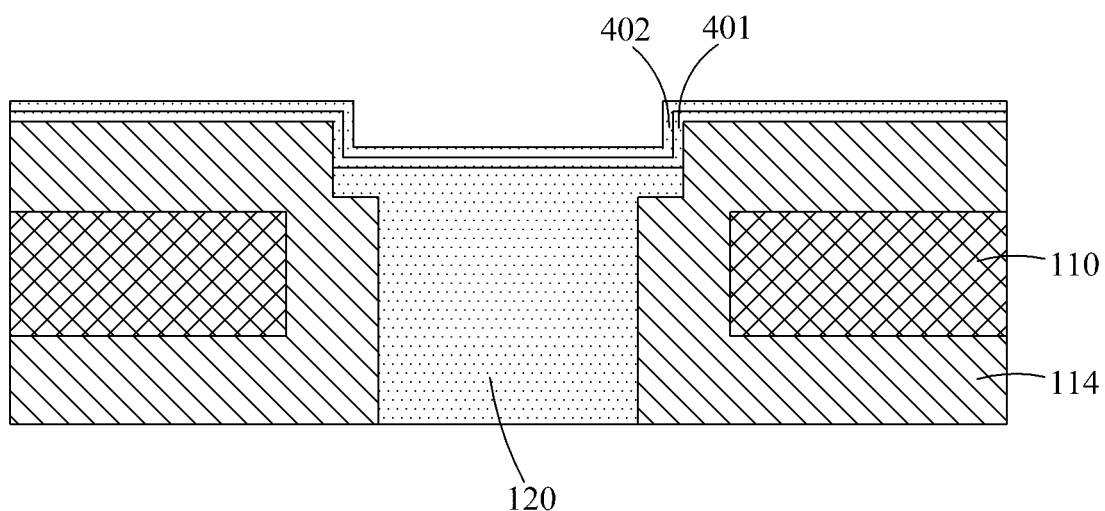
Figure 8C:
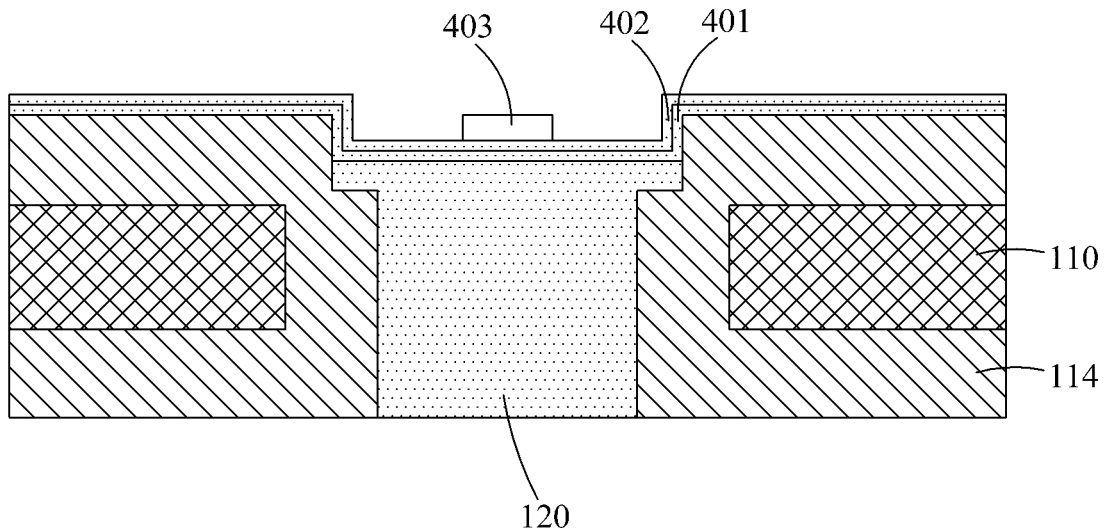
Figure 8D:
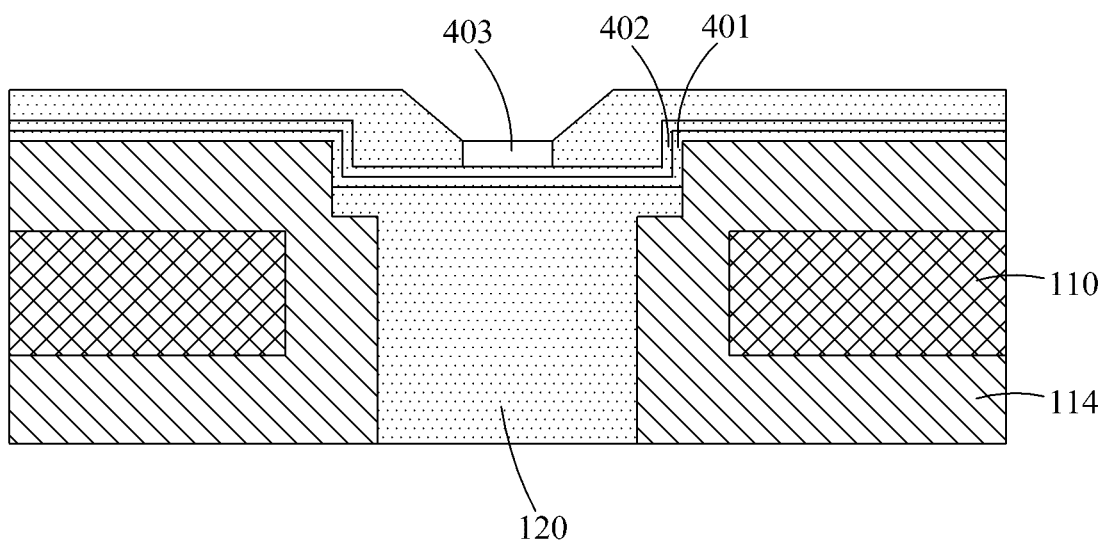
Figure 8E:
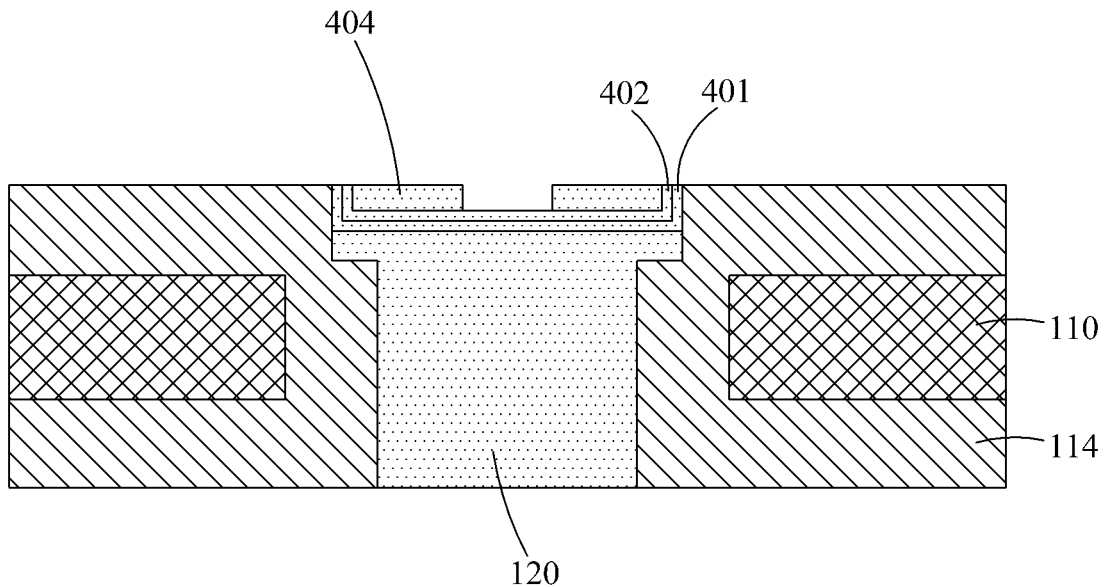
Figure 8F:
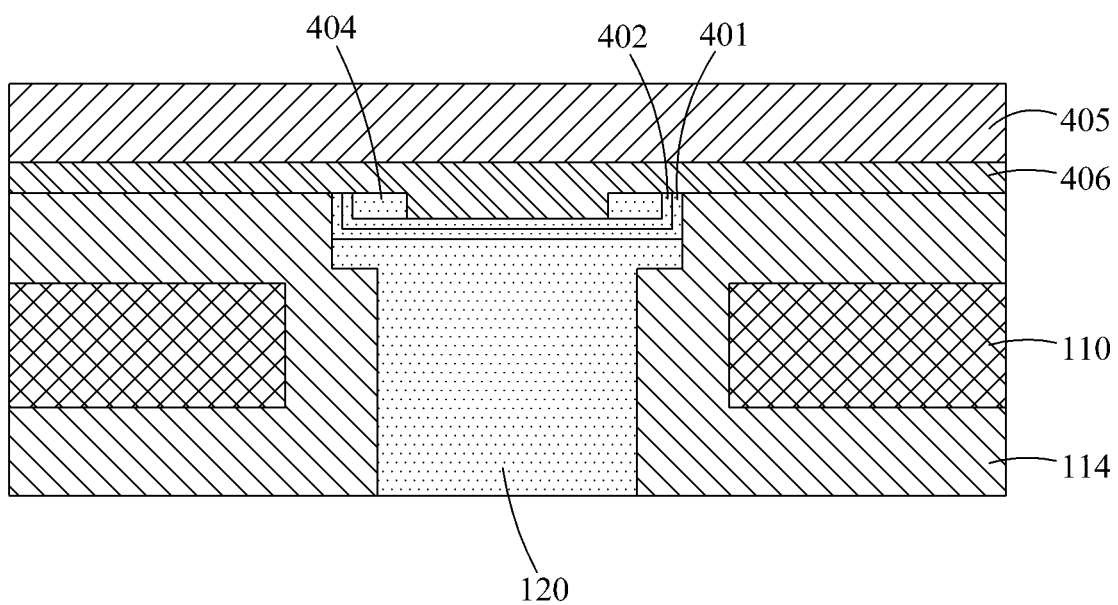
Figure 8G:
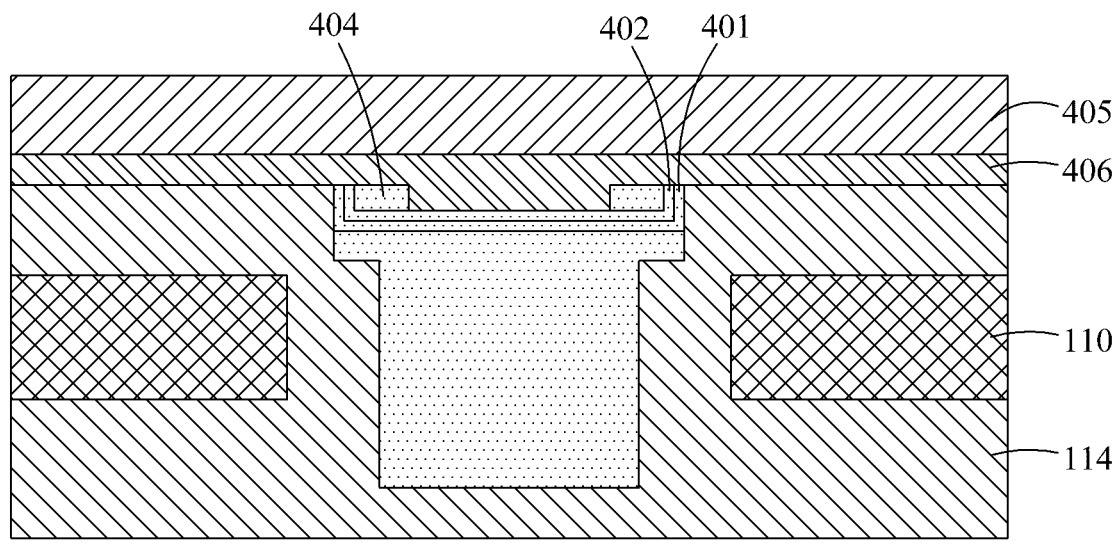
Figure 8H:
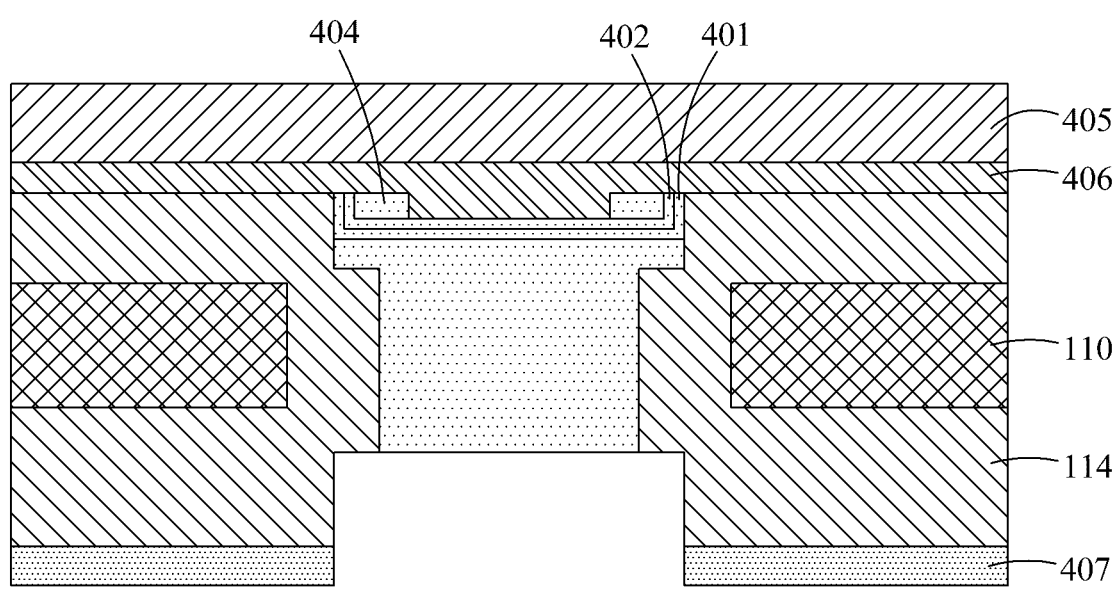
Figure 8I:
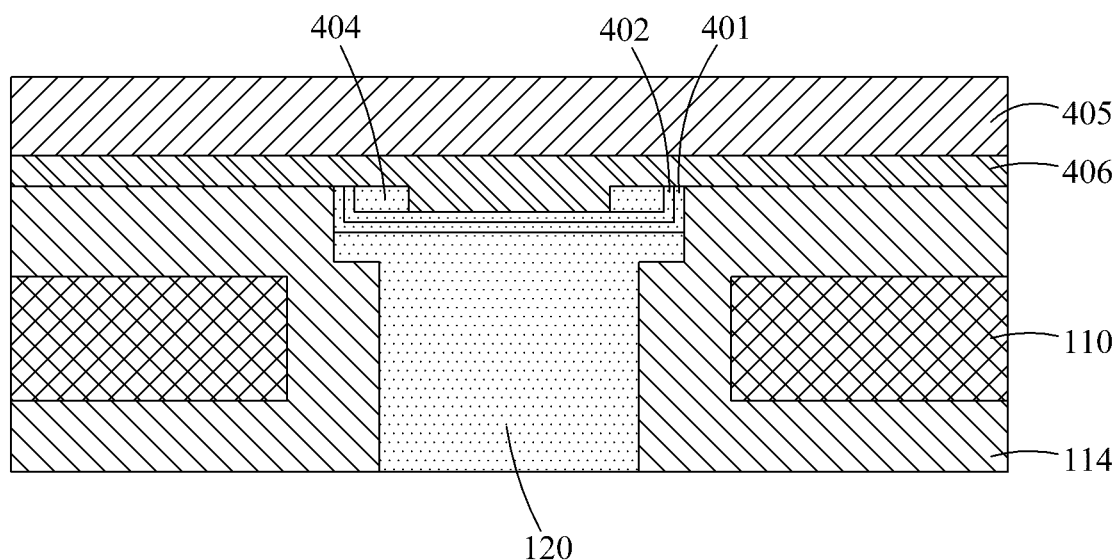
Figure 8J:
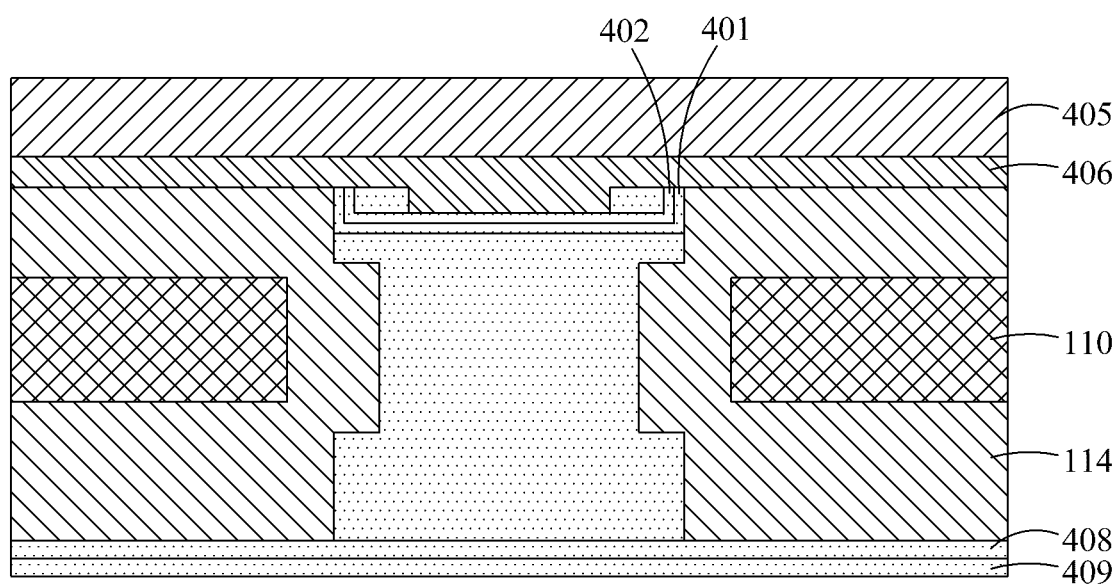
Figure 8K:
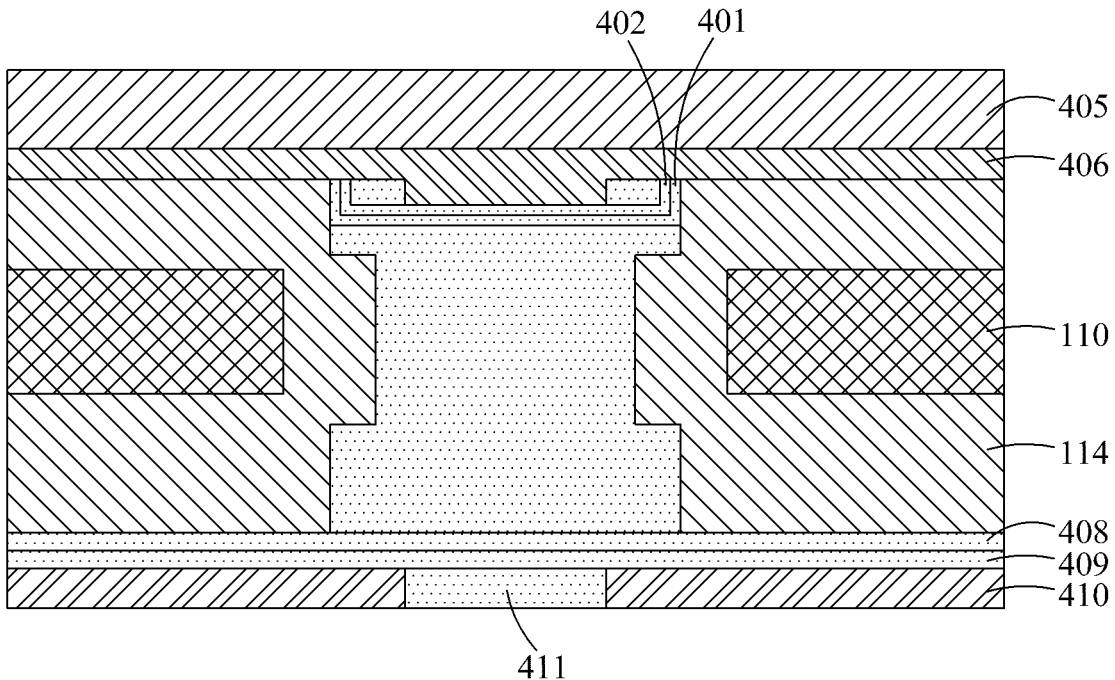
Figure 8L:
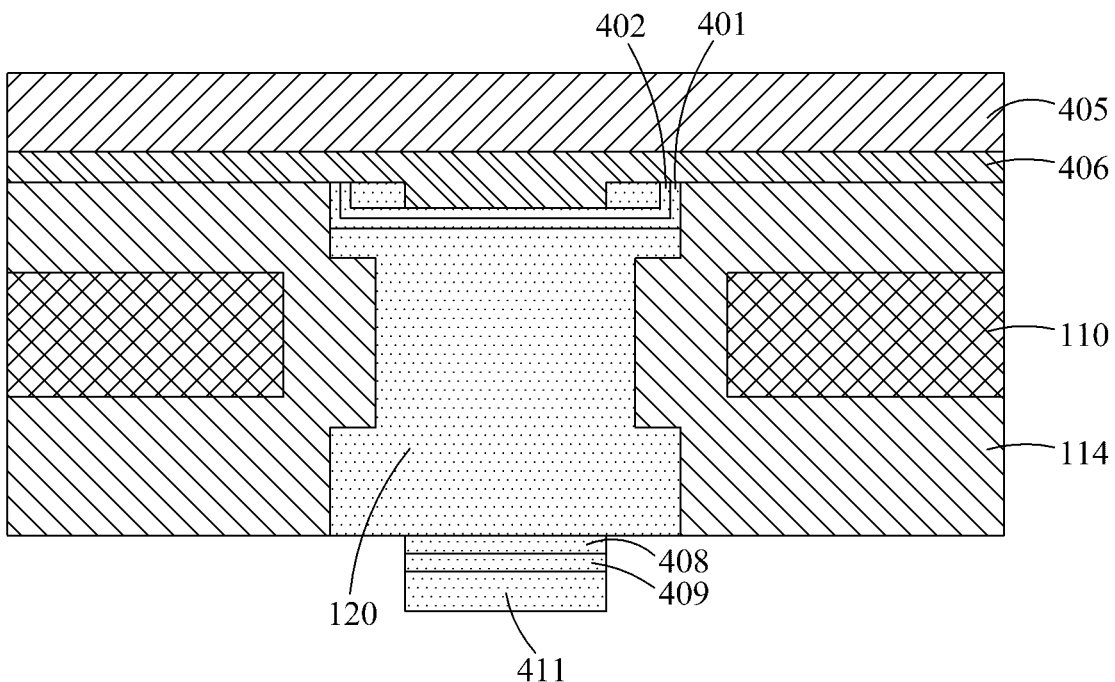
Figure 8M:
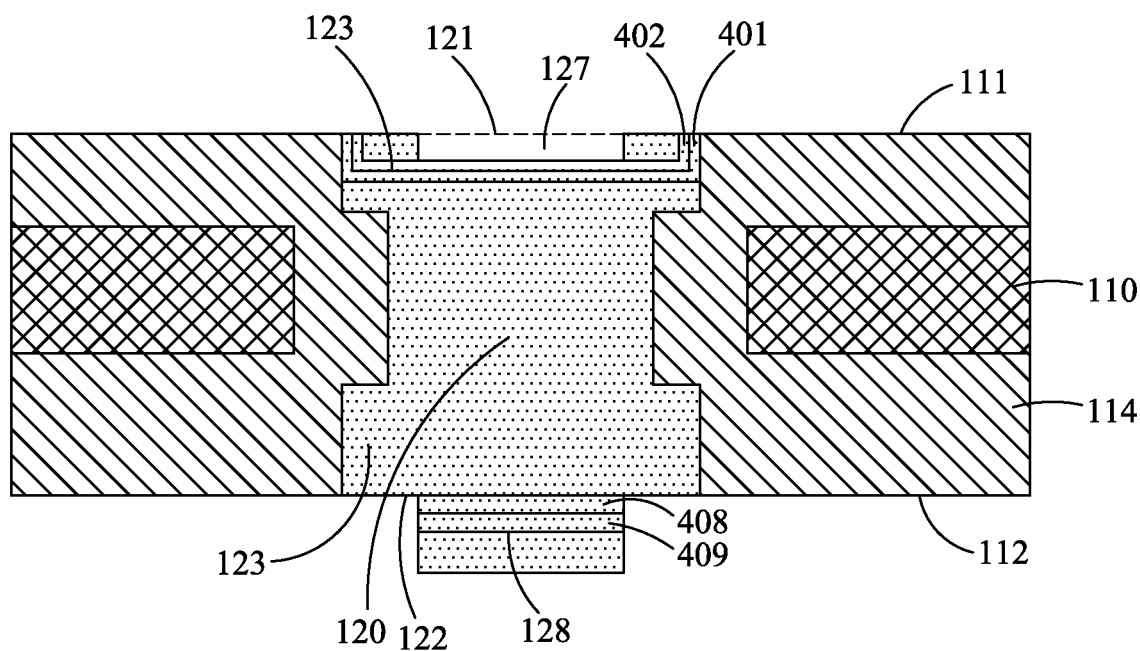

Here is an exemplary embodiment of the fabrication process to fabricate the TSV substrate structure in the foregoing embodiments. Referring to FIGS. 8A to 8M, which schematically illustrate the evolutional steps of fabricating the TSV substrate structure of FIG. 1, wherein the copper is used to be the conductor material as an example. At first, a substrate 110 having a TSV filled with copper is provided with an insulator layer 114 of oxide formed on both the substrate surfaces. The back or bottom surface of the substrate 110 is then planarized or polished until the exposure of the copper, as shown in FIG. 8A. Next, a barrier layer 401 and a seed layer 402 are electroplated on the top surface of the substrate 110, as shown in FIG. 8B, where the barrier layer 401 and seed layer 402 are conductor themselves. To form the extensional part of the conductor unit 120, the photolithography is used to pattern a photoresist layer 403 on the seed layer 402, as shown in FIG. 8C. A copper film 404 is electroplated on the seed layer 402 as shown in FIG. 8D, where the copper film 404 cannot be deposited on the photoresist 403 by electroplating. Next, the photoresist layer 403 is removed, and the substrate 110 is planarized or polished by the CMP (chemical mechanical planarization) method until the insulator layer 114 of oxide, as shown in FIG. 8E. A carrier 405 is then adhered onto the top surface of the substrate 110 with an adhesive layer 406 formed between the carrier 405 and the substrate 110, as shown in FIG. 8F. Then another oxide layer is formed on the back surface of the substrate 110, as shown in FIG. 8G. Next, an appropriate pattern of photoresist layer 407 is selectively formed on the back surface of the substrate 110 by the photolithography to etch the oxide layer 114, as shown in FIG. 8H. After that, the photoresist 407 is removed, and the copper layer is then electroplated on the back surface of the substrate 110, as shown in FIG. 8I. Then a barrier layer 408 and a seed layer 409 are electroplated on the back surface of the substrate 110, as shown in FIG. 8J. Next, the photolithography is used to pattern a photoresist layer 410 on the back surface of the substrate 110, and copper is then electroplated, as shown in FIG. 8K. The photoresist 410 is then removed, and the exposed barrier layer 408 and seed layer 409 are then removed, too, as shown in FIG. 8L. Finally, the carrier 405 is removed, as shown in FIG. 8M, to complete the TSV substrate structure 100 as in FIG. 1. Also, the foregoing fabrication process may be used to fabricate other types of the TSV substrate structures according to the embodiments of this present disclosure, and is not limited to this exemplary TSV substrate structure of the $recess_{top}$-$protrusion_{bottom}$ type.

As shown in FIG. 1, the conductor unit 120 may have a recess 127 at one end and a protrusion 128 at the other end. Also, as shown in FIGS. 2A and 2B, the conductor unit 120 may either have a protrusion 128 at each end or have a recess 127 at each end. In the following embodiment, we would like to provide means for fabricating a first substrate structure in which the conductor unit 120 has a recess at one end and a second substrate structure in which the conductor unit 120 has a protrusion at one end. After that, the substrate structures are combined to be a stacked assembly, with the recess corresponded with the protrusion.

Figure 9A:
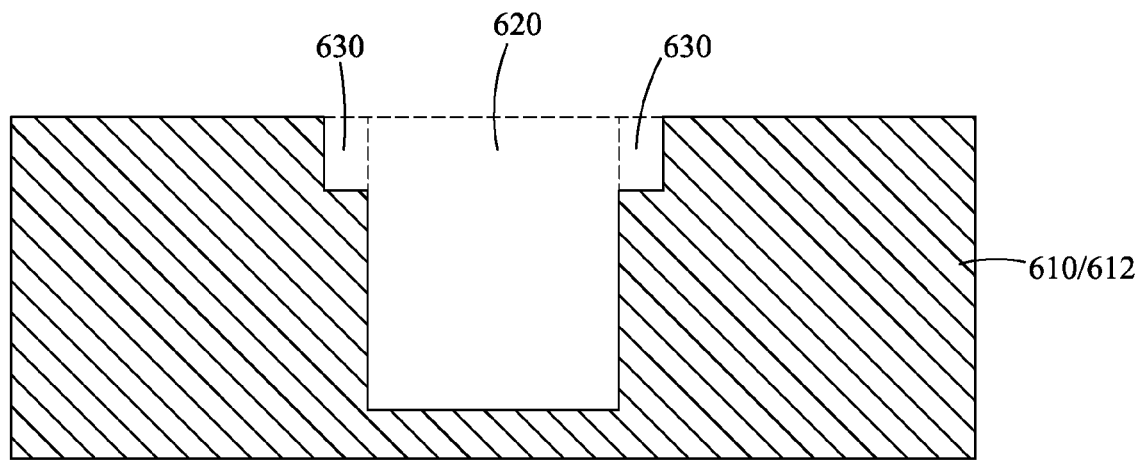
FIGS. 9A to 9F illustrate the evolutional steps of fabricating a substrate structure in which the conductor unit has a recess or a protrusion at one end.
Figure 9B:
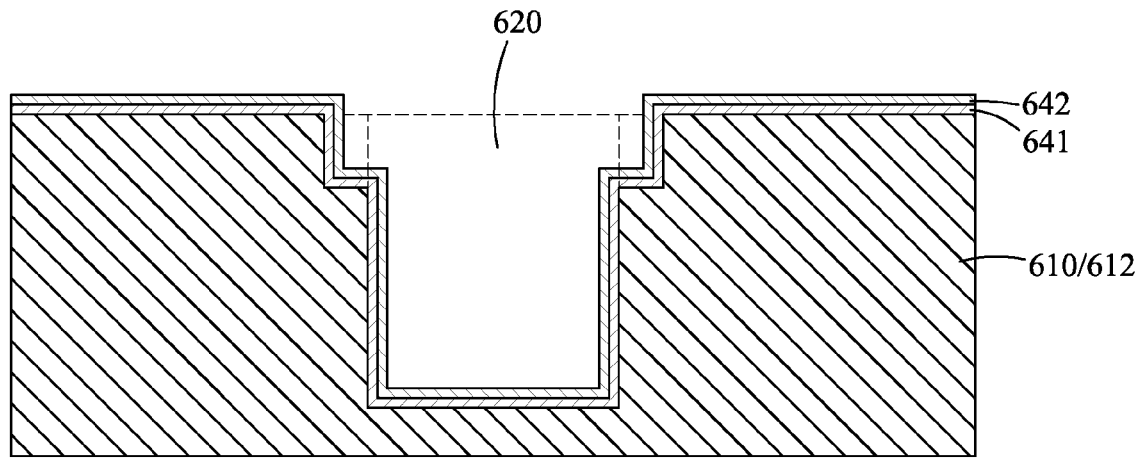
Figure 9C:
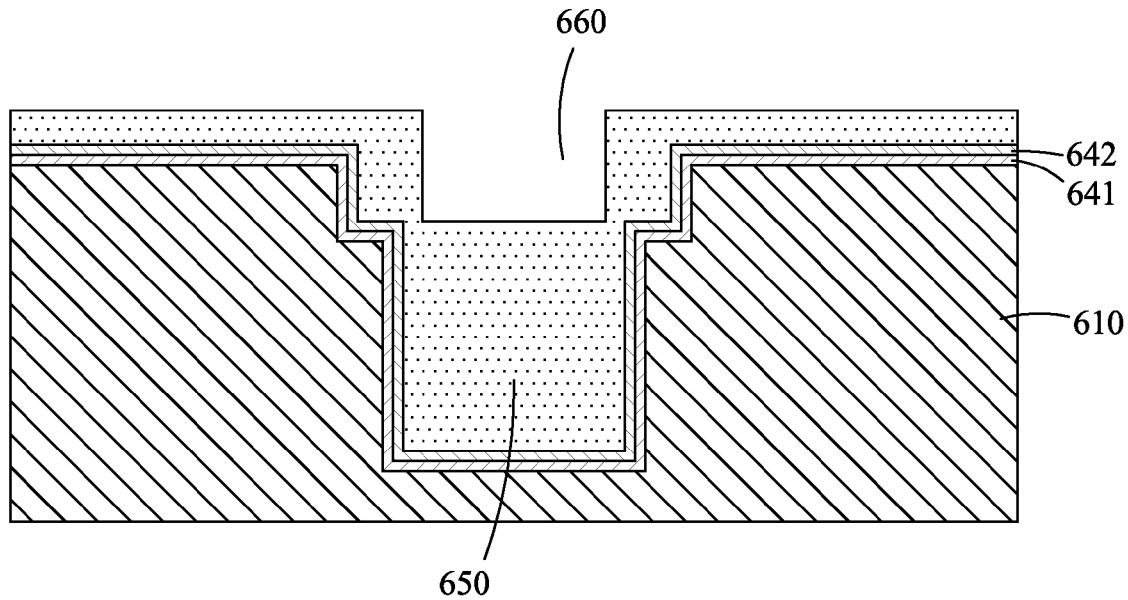
Figure 9D:
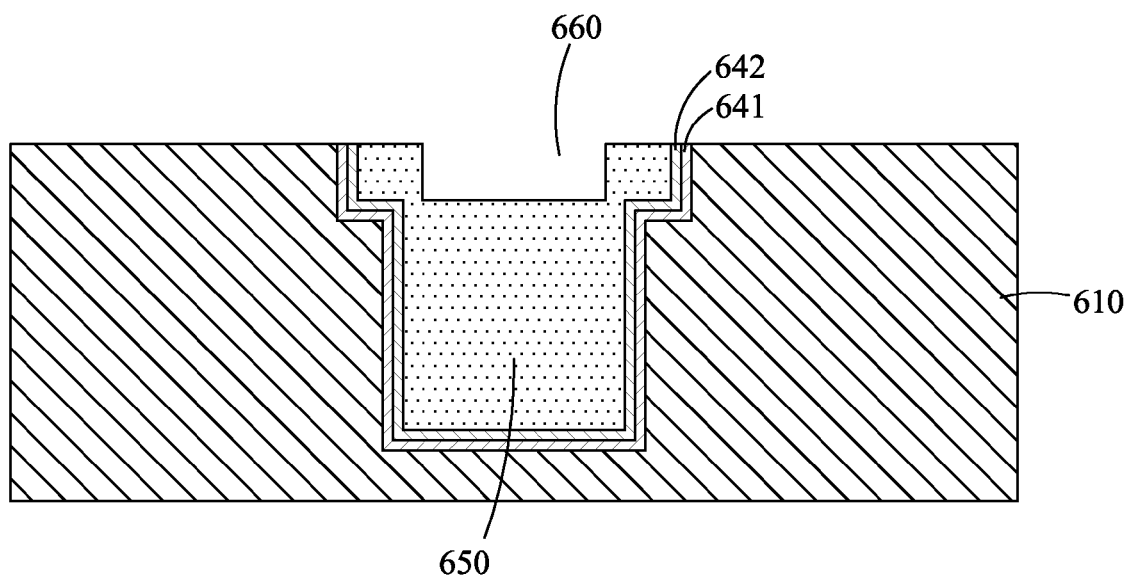

Referring to FIGS. 9A to 9D, which schematically illustrate the evolutional steps of fabricating a substrate structure in which the conductor unit has a recess at one end. At first, a silicon wafer is provided as a first substrate 610. Wherein, a cylindrical trench 620 is formed in the first substrate 610, and the cylindrical trench 620 may have an extensional part 630 which surrounds the cylindrical trench 620, like a ring around a cylinder on all sides, in proximity to a top surface of the first substrate 610, as shown in FIG. 9A. Next, a barrier layer 641 and a seed layer 642 are deposited on the top surface of the first substrate 610, so that the barrier layer 641 and the seed layer 642 are confirmally formed on sidewalls and bottoms of the cylindrical trench 620 and the extensional part 630, as shown in FIG. 9B, where the barrier layer 641 may be formed of metal, such as tantalum (Ta). Next, a conductor material, such as copper (Cu), is then electroplated to form a conductor layer 650 on the barrier layer 641 and the seed layer 642, so that the conductor layer 650 under-fills the cylindrical trench 620 and the extensional part 630 except that a recess 660 formed in the conductor layer 650 in the cylindrical trench 620, as shown in FIG. 9C. Next, a part of the conductor layer 650, the barrier layer 641 and the seed layer 642 are removed from top to bottom by the etching processor the chemical mechanical planarization (CMP) process, until the top surface of the first substrate 610 is exposed, as shown in FIG. 9D. That is, the etching process or the CMP process will stop at the top surface of the first substrate 610, such that the lower part of the recess 660 remains in the conductor layer 650 in the cylindrical trench 620.

Figure 9E:
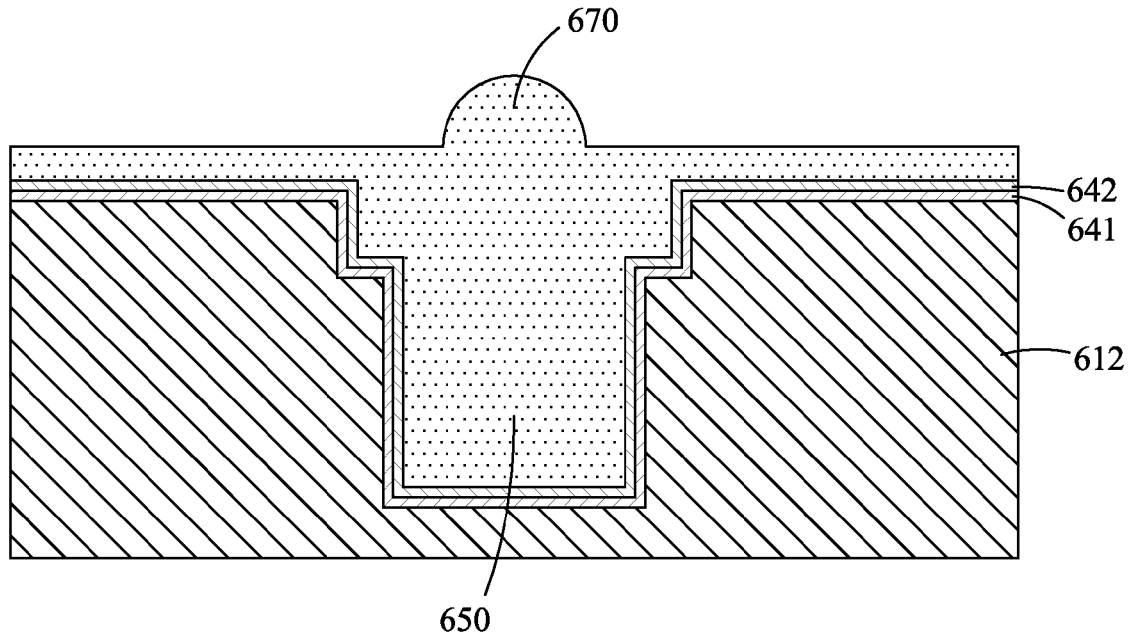
Figure 9F:
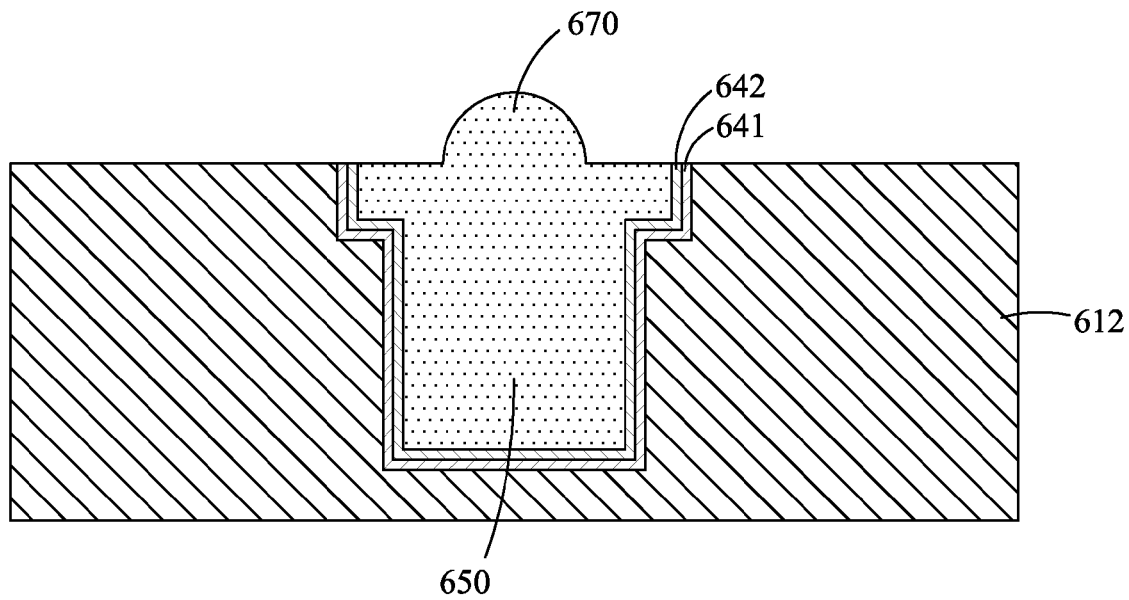

Referring to FIGS. 9A, 9B, 9E and 9F, which schematically illustrate the evolutional steps of fabricating a substrate structure in which the conductor unit has a protrusion at one end. At first, another silicon wafer is provided as a second substrate 612. Wherein, a cylindrical trench 620 is formed in the second substrate 612, and the cylindrical trench 620 may have an extensional part 630 which surrounds the cylindrical trench 620 in proximity to a top surface of the second substrate 612, as shown in FIG. 9A. Next, a barrier layer 641 and a seed layer 642 are deposited on the top surface of the second substrate 612, so that the barrier layer 641 and the seed layer 642 are confirmally formed on sidewalls and bottoms of the cylindrical trench 620 and the extensional part 630, as shown in FIG. 9B, where the barrier layer 641 may be formed of metal or cobalt tungsten phosphide (CoWP). Next, a conductor material, such as copper (Cu), is then electroplated to form a conductor layer 650 on the barrier layer 641 and the seed layer 642, so that the conductor layer 650 over-fills the cylindrical trench 620 and the extensional part 630, with a protrusion 670 formed on the conductor layer 650 in the cylindrical trench 620, as shown in FIG. 9E. Next, the second substrate 612 is then immersed in a bath of etchant, such as a solution including copper sulphate ($CuSO_4$) and hydrogen peroxide ($H_2O_2$), to remove a part of the conductor layer 650 as well as the barrier layer 641 and the seed layer 642 exceeding the top surface of the substrate by wet etching, so that the protrusion 670 remains like a hill on the top of the conductor layer 650 in the cylindrical trench 620, as shown in FIG. 9F. Also, the removal of the part of the conductor layer 650 as well as the barrier layer 641 and the seed layer 642 can be done by the other means, such as etching or CMP.

Figure 10A:
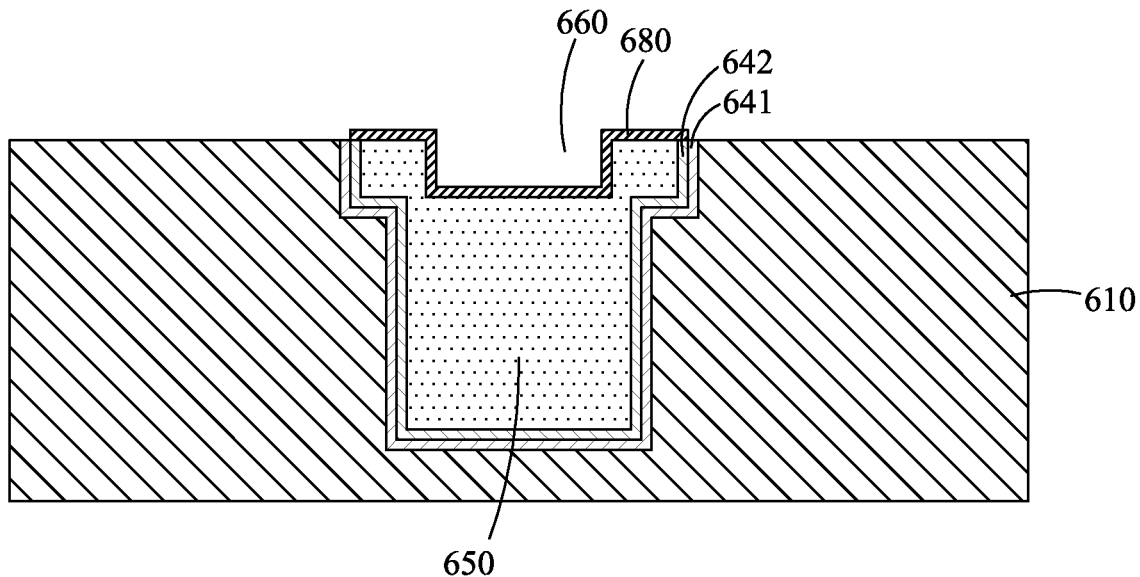
FIGS. 10A to 10C illustrate the evolutional steps of combining substrate structures to form a stacked assembly.
Figure 10B:
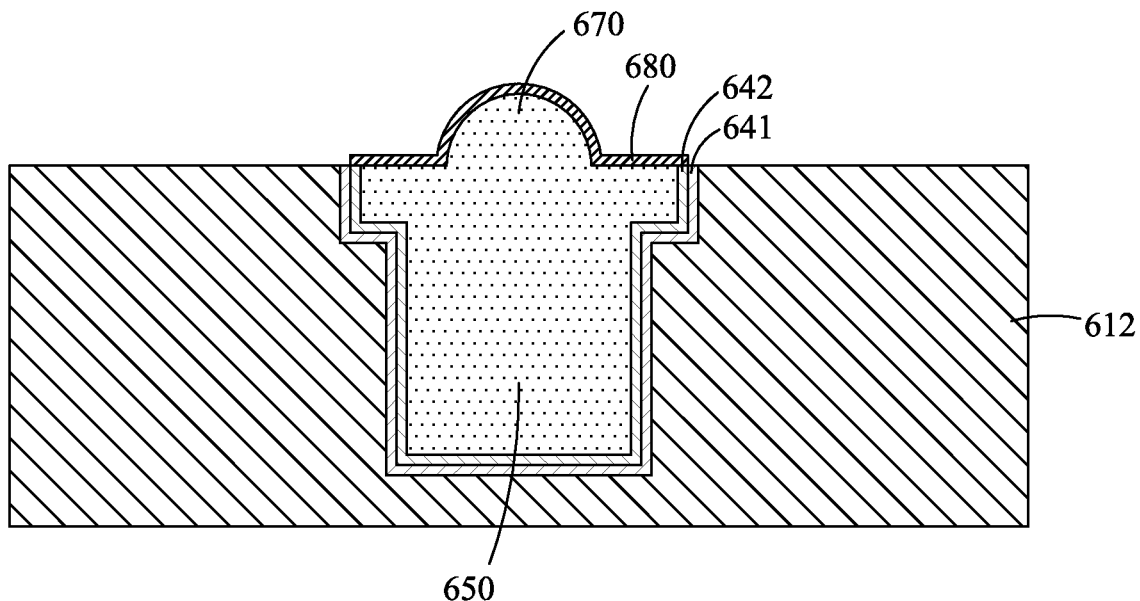
Figure 10C:
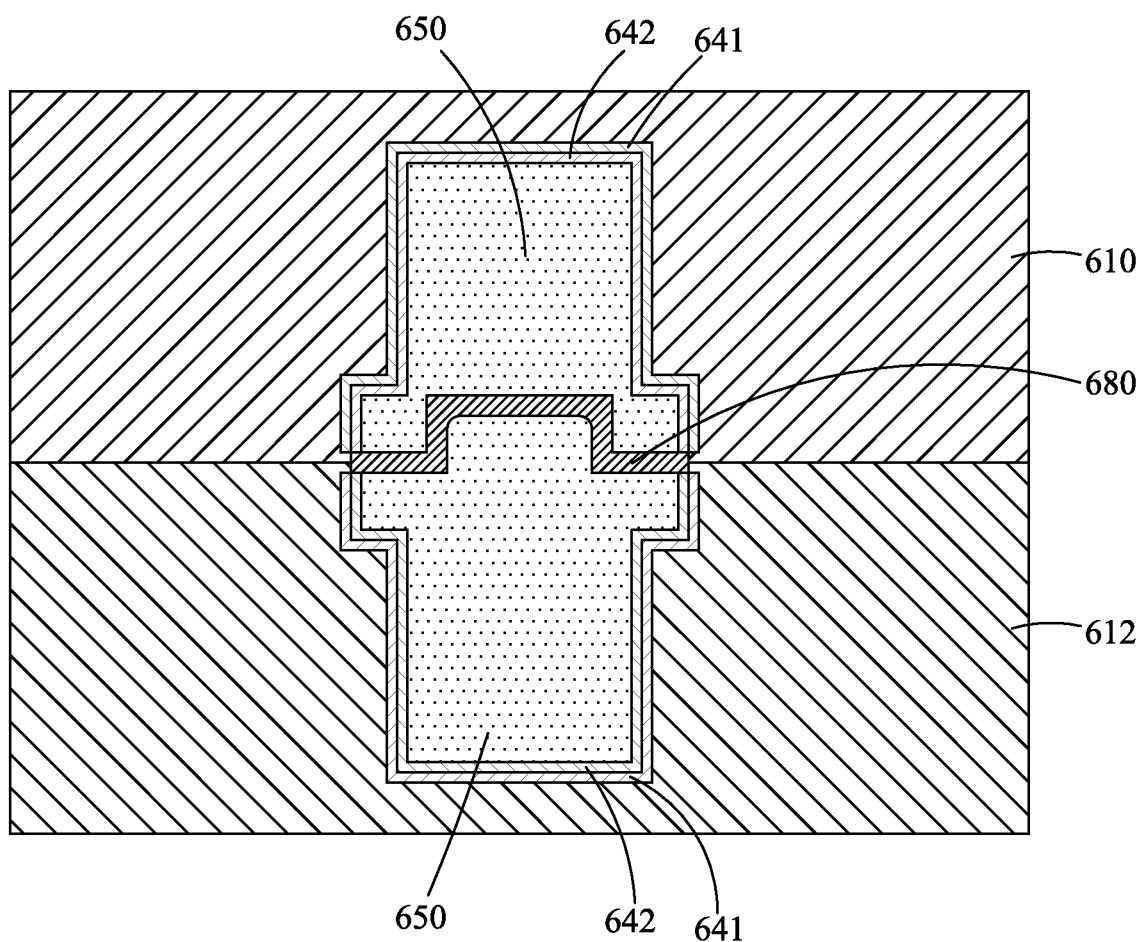

Referring to FIGS. 10A to 10C, which schematically illustrate the evolutional steps of combining the first substrate 610 with the second substrate 612 to form a stacked assembly of substrate structures. A solder layer 680 is formed on the first substrate 610, so that the solder layer 680 is confirmally grown in the recess 660 and covers the conductor layer 650 in the cylindrical trench 620, as shown in FIG. 10A. Also, the solder layer 680 is formed on the second substrate 612, so that the solder layer 680 is confirmally grown on the protrusion 670 and covers the conductor layer 650 in the cylindrical trench 620, as shown in FIG. 10B. Then, the first substrate 610 is turned upside down and stacked on the second substrate 612, with the recess 660 corresponded with the protrusion 670 as shown in FIG. 10C. Further, the other surface of either the first substrate 610 or the second substrate 612 can be planarized or polished until the exposure of the conductor layer 650, so that the conductor layer 650 may act as a TSV to conduct possible circuit wiring on the opposing sides of the stacked assembly. Also, the other surface of either the first substrate 610 or the second substrate 612 can be further processed so that the conductor unit 120 as shown in FIG. 1 may have another recess or protrusion at the other end.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A method of fabricating a stacked assembly, comprising steps of:
    providing a first substrate and a second substrate, each having a cylindrical trench with an extensional part surrounding the cylindrical trench;
    forming a barrier layer and a seed layer on the surfaces of the first and second substrates, so that the barrier layer and the seed layer are confirmally formed on sidewalls and bottoms of the cylindrical trenches and the extensional parts;
    forming a first conductor layer on the seed layer of the first substrate, so that the first conductor layer under-fills the cylindrical trench and the extensional part of the first substrate, with a recess formed in the first conductor layer in the cylindrical trench;
    removing, from top to bottom, a part of the first conductor layer, the barrier layer and the seed layer until a top surface of the first substrate is exposed, so that the recess remains in the first conductor layer in the cylindrical trench;
    forming a second conductor layer on the seed layer of the second substrate, so that the second conductor layer over-fills the cylindrical trench and the extensional part of the second substrate, with a protrusion formed on the second conductor layer in the cylindrical trench;
    etching to remove a part of the second conductor layer as well as the barrier layer and the seed layer exceeding a top surface of the second substrate, so that the protrusion remains on the second conductor layer in the cylindrical trench;
    forming a solder layer on the first and second substrates, so that the solder layer is formed in the recess of the first substrate and on the protrusion of the second substrate; and
    stacking the first substrate on the second substrate, with the recess corresponded with the protrusion.

2. The method of claim 1, wherein the removing step is performed by a chemical mechanical planarization process.

3. The method of claim 1, wherein the etching step is performed by a etching process.

* * * * *